(12) United States Patent
Lin et al.

(10) Patent No.: US 12,224,243 B2
(45) Date of Patent: Feb. 11, 2025

(54) SEMICONDUCTOR MEMORY DEVICE HAVING WORD LINES SURROUNDED BY MEMORY LAYERS AND METHOD OF MAKING THE SEMICONDUCTOR MEMORY DEVICE

(71) Applicant: TAIWAN SEMICONDUCTOR MANUFACTURING COMPANY, LTD., Hsinchu (TW)

(72) Inventors: Meng-Han Lin, Hsinchu (TW); Chia-En Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 198 days.

(21) Appl. No.: 17/708,199

(22) Filed: Mar. 30, 2022

(65) Prior Publication Data

US 2023/0317616 A1 Oct. 5, 2023

(51) Int. Cl.
*H01L 23/535* (2006.01)
*H01L 23/528* (2006.01)
*H10B 51/20* (2023.01)
*H10B 51/30* (2023.01)

(52) U.S. Cl.
CPC ........ *H01L 23/535* (2013.01); *H01L 23/5283* (2013.01); *H10B 51/20* (2023.02); *H10B 51/30* (2023.02)

(58) Field of Classification Search
CPC . H01L 23/528; H01L 23/5283; H01L 23/535; H10B 51/00; H10B 51/10; H10B 51/20; H10B 51/30; H10B 51/40
See application file for complete search history.

(56) References Cited

U.S. PATENT DOCUMENTS

| 9,449,986 B1 * | 9/2016 | Yoon | H10B 43/10 |
| 2014/0162420 A1 * | 6/2014 | Oh | H10B 43/27 |
| | | | 438/270 |
| 2017/0194345 A1 * | 7/2017 | Nojima | H10B 43/27 |
| 2018/0108664 A1 * | 4/2018 | Lee | G11C 16/26 |

(Continued)

FOREIGN PATENT DOCUMENTS

| CN | 111316435 A | * | 6/2020 | ....... H01L 21/76805 |
| KR | 20200034880 A | * | 4/2020 | ......... H01L 29/4234 |

*Primary Examiner* — Matthew E Warren
(74) *Attorney, Agent, or Firm* — Birch, Stewart, Kolasch & Birch, LLP

(57) ABSTRACT

A semiconductor memory device includes first and second memory units, and first and second staircase vias. The first memory unit includes two first source/bit line portions separated from each other, a first word line surrounding the first source/bit line portions, a first memory film surrounding the first word line, and a first channel region between the first memory film and the first source/bit line portions. The second memory unit is disposed over the first memory unit, and includes two second source/bit line portions separated from each other, a second word line surrounding the second source/bit line portions, a second memory film surrounding the second word line, and a second channel region between the second memory film and the second source/bit line portions. The first and second staircase vias respectively penetrate the first and second memory films, and are respectively and electrically connected to the first and second word lines.

20 Claims, 17 Drawing Sheets

(56) References Cited

U.S. PATENT DOCUMENTS

2020/0075631 A1* 3/2020 Dong .................. H01L 29/7827
2021/0335802 A1* 10/2021 Lee ................... H01L 29/40117
2021/0399003 A1* 12/2021 Shin ....................... H10B 43/50

* cited by examiner

SEMICONDUCTOR MEMORY DEVICE HAVING WORD LINES SURROUNDED BY MEMORY LAYERS AND METHOD OF MAKING THE SEMICONDUCTOR MEMORY DEVICE

BACKGROUND

Semiconductor memory devices have wide applications in computing, portable devices, automobiles, internet of things (IoT), etc. With the requirement of semiconductor memory devices to have increasingly higher memory capacity, while decreasing the memory cell dimensions, memory arrays are being developed to have a three-dimensional (3D) architecture instead of a two-dimensional (2D) architecture, so that the memory capacity of the semiconductor memory device can be effectively increased with only a relatively small area penalty. Nevertheless, a memory array with a 3D architecture has a relatively complicated circuit, and is relatively difficult to manufacture. Hence, there is continuous demand to improve the efficiency and yield while reducing the cost of manufacturing the semiconductor memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
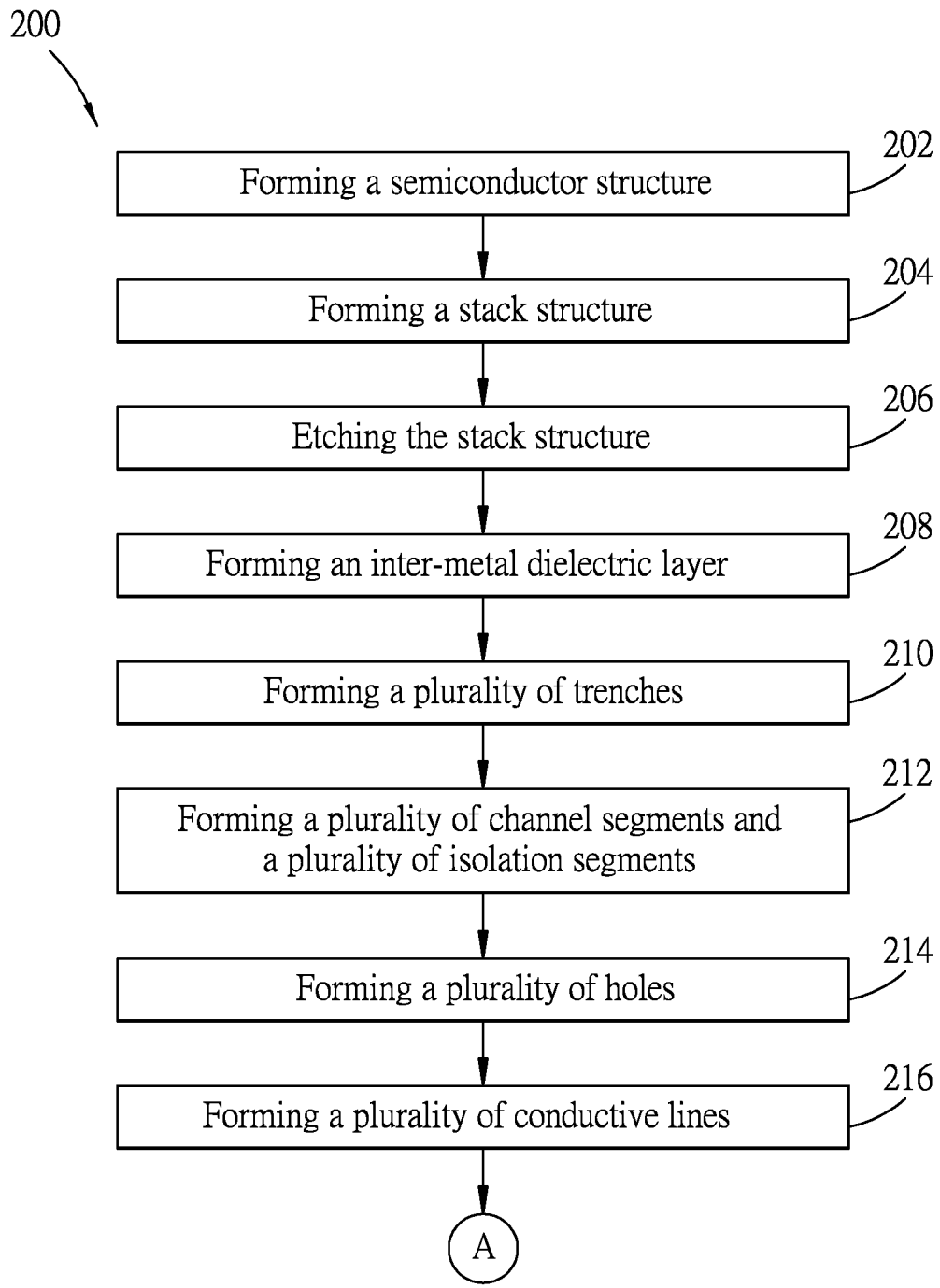
FIGS. 1A and 1B illustrate a method of making a semiconductor memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
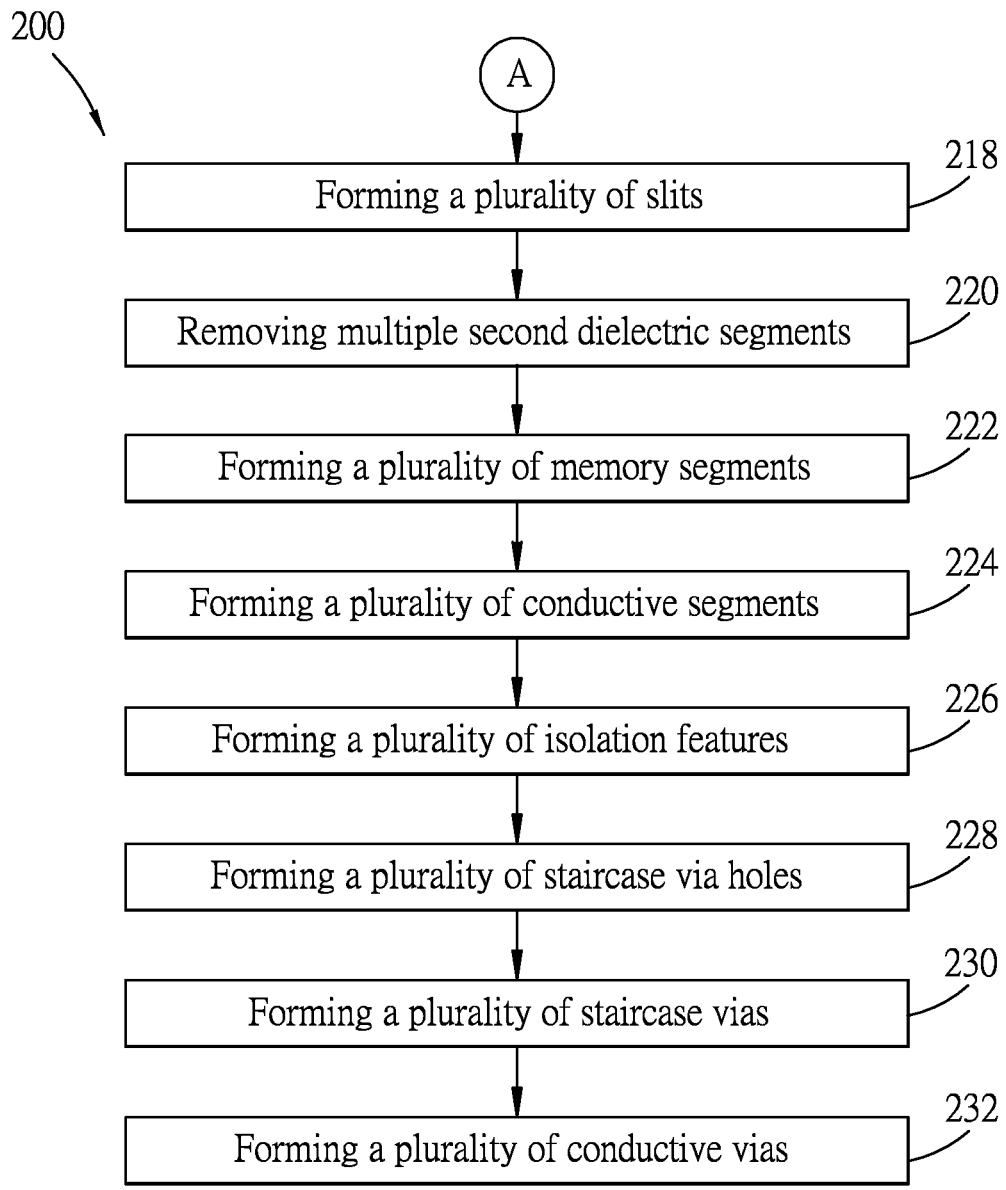

FIGS. 1A and 1B illustrate a method 200 of manufacturing a semiconductor memory device 300 (see FIG. 20) in accordance with some embodiments of this disclosure. FIGS. 2 to 20 are schematic views showing intermediate stages of the method 200 as depicted in FIGS. 1A and 1B. Additional steps which are not limited to those described in the method 200, can be provided before, during or after the manufacturing of the semiconductor memory device 300, and some of the steps described herein may be replaced by other steps or be eliminated. Similarly, additional features may be present in the semiconductor memory device 300, and/or features present may be replaced or eliminated in additional embodiments.

Figure 2:
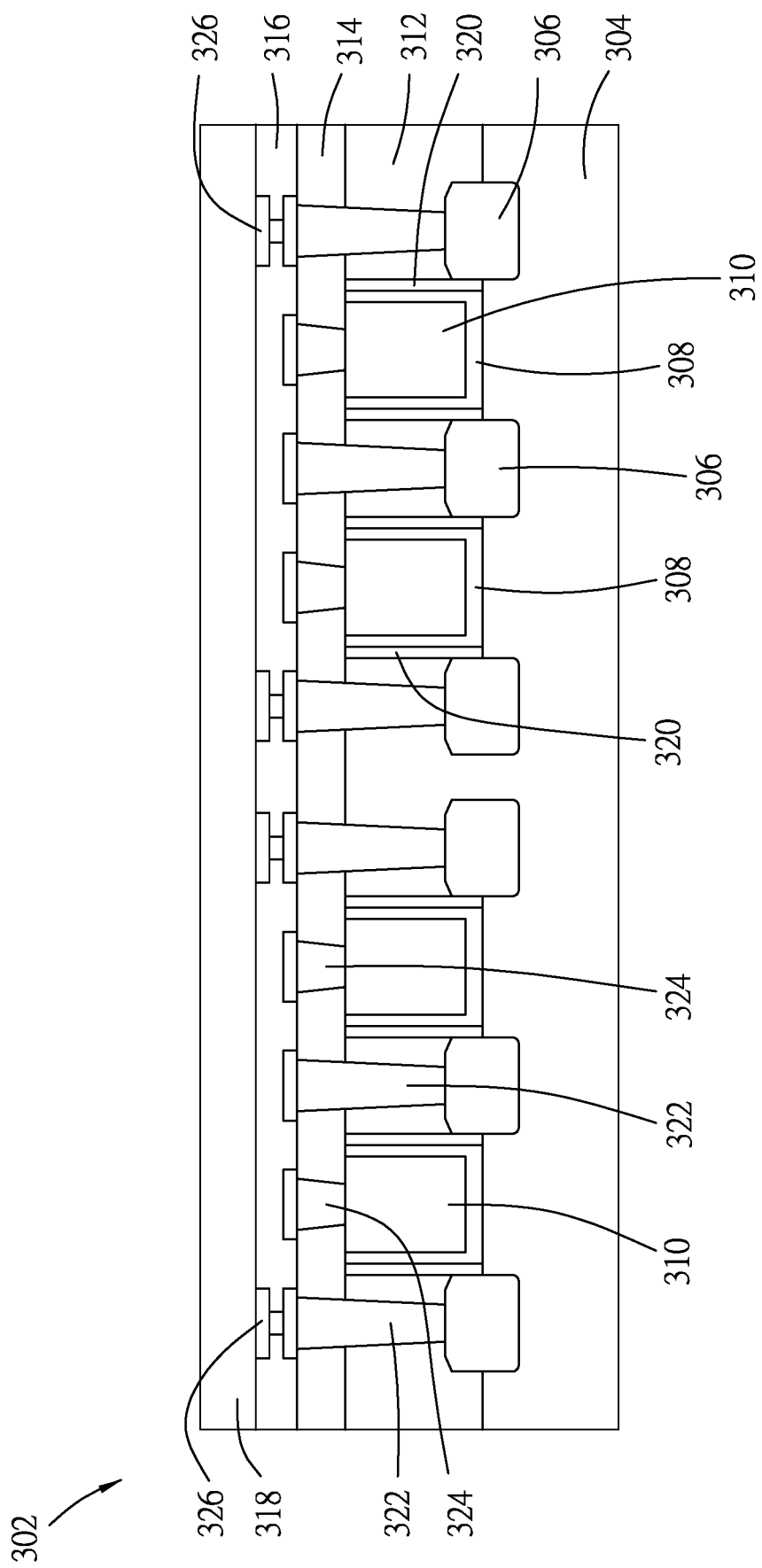
FIG. 2 is a schematic view showing a semiconductor structure of a semiconductor memory device in accordance with some embodiments.

Referring to FIG. 1A, the method 200 begins at step 202, where a semiconductor structure is formed. FIG. 2 is a schematic sectional view of the semiconductor structure 302, which may include a semiconductor substrate 304, a plurality of source/drain regions 306, a plurality of gate electrodes 310 each surrounded by a gate dielectric layer 308, a plurality of spacers 320 that are formed on sidewalls of the gate dielectric layer 308, first to fourth interlayer dielectric (ILD) layers 312, 314, 316, 318, a plurality of source/drain contacts 322, a plurality of gate contacts 324, and a plurality of conductive features 326.

In some embodiments, the semiconductor substrate 304 may be a suitable substrate, such as an elemental semiconductor or a compound semiconductor. The elemental semiconductor may contain a single species of atom, such as Si, Ge or other suitable materials, e.g., other elements from column XIV of the periodic table. The compound semiconductor may be composed of at least two elements, such as GaAs, SiC, SiGe, GaP, InSb, InAs, InP, GaAsP, GaInP, GaInAs, AlGaAs, AlInAs, GaInAsP, or the like. In some embodiments, the semiconductor substrate 304 may be a semiconductor-on-insulator (SOI) substrate, such as silicon germanium-on-insulator (SGOI) substrate, or the like. In some embodiments, an SOI substrate may include an epitaxially grown semiconductor layer, such as Si, Ge, SiGe, any combination thereof, or the like, which is formed over an oxide layer. In some embodiments, the source/drain regions 306 may be formed in the semiconductor substrate 304 or may partially extend above the semiconductor substrate 304. The source/drain regions 306 may be made of silicon carbide (SiC), silicon phosphorous (SiP), phosphorous-doped silicon carbon (SiCP), other suitable materials, or any combination thereof for n-type semiconductor devices. The source/drain regions 306 may be made of silicon germanium (SiGe), other suitable materials, or any combination thereof, and may be doped with p-type impurities for p-type semiconductor devices. In some embodiments, the source/drain regions 306 may be formed by metal-organic CVD (MOCVD), liquid phase epitaxy (LPE), vapor phase epitaxy (VPE), molecular beam epitaxy (MBE), selective epitaxy growth (SEG), other suitable techniques, or any combination thereof. In some embodiments, the first ILD layer 312 may be disposed above the semiconductor substrate 304, and may be made of a material that includes silicon oxide, undoped silicate glass (USG), phosphosilicate glass (PSG), borosilicate glass (BSG), boron-doped phosphosilicate glass (BPSG), fluorine-doped silicate glass (FSG), other suitable materials, or any combination thereof. The first ILD layer 312 may be made by spin coating, chemical vapor deposition (CVD) (including flowable CVD (FCVD), plasma enhanced CVD (PECVD), low pressure CVD (LPCVD), etc.), other suitable techniques, or any combination thereof. The second to fourth ILD layers 314, 316, 318 may each be made of a material identical to or different from that of the first ILD layer 312, according to practical requirements. The spacers 320 are surrounded by the first ILD layer 312. In some embodiments, each of the spacers 320 may include multiple sub-layers (not shown) each being made of silicon oxide, silicon nitride, silicon oxynitride, other suitable materials, or any combination thereof, and each being made by CVD, physical vapor deposition (PVD), atomic layer deposition (ALD), other suitable techniques, or any combination thereof. In some embodiments, the gate dielectric layer 308 may be made of silicon oxide, silicon nitride, a high-k dielectric material, other suitable materials, or any combination thereof. In some embodiments, the high-k dielectric material may be a metal oxide or a silicate of Hf, Al, Ga, Ta, Gd, Y, Zr, La, Mg, Ba, Ti, Pb, other suitable materials, or any combination thereof. In some embodiments, the gate dielectric layer 308 may be formed to have any suitable thickness value, and may be formed by ALD, PECVD, other suitable techniques, or any combination thereof. In some embodiments, the gate electrodes 310 may be made of W, Al, Ta, Ti, Ni, Cu, Co, other suitable materials, or any combination thereof. In some embodiments, the gate electrodes 310 may be formed by ALD, CVD, PVD, plating, other suitable techniques, or any combination thereof. In some embodiments, although not shown in FIG. 2, there may be multiple intermediate layers between each of the gate electrodes 310 and a corresponding one of the gate dielectric layers 308, such as glue layers, work function material layers, etc., according to practical requirements. In some embodiments, the source/drain contacts 322 may extend through the first and second ILD layers 312, 314, and may be respectively and electrically connected to the source/drain regions 306. In some embodiments, the gate contacts 324 may extend through the second ILD layer 314, and may be respectively and electrically connected to the gate electrodes 310. In some embodiments, each of the source/drain contacts 322 and the gate contacts 324 may be made of tungsten or other suitable materials. The conductive features 326 may be formed in the third ILD layer 316, and may be used for rerouting the source/drain contacts 322 and/or gate contacts 324, or may be used for electrical connection with devices subsequently formed thereon. In some embodiments, the conductive features 326 may be made of Cu, Co, W, Ru, Mo, Al, other suitable materials, or any combination thereof. In some embodiments, the fourth ILD layer 318 may be a protection layer covering the conductive features 326, and may be made of a dielectric material, an insulating material, or other suitable materials.

Figure 3:
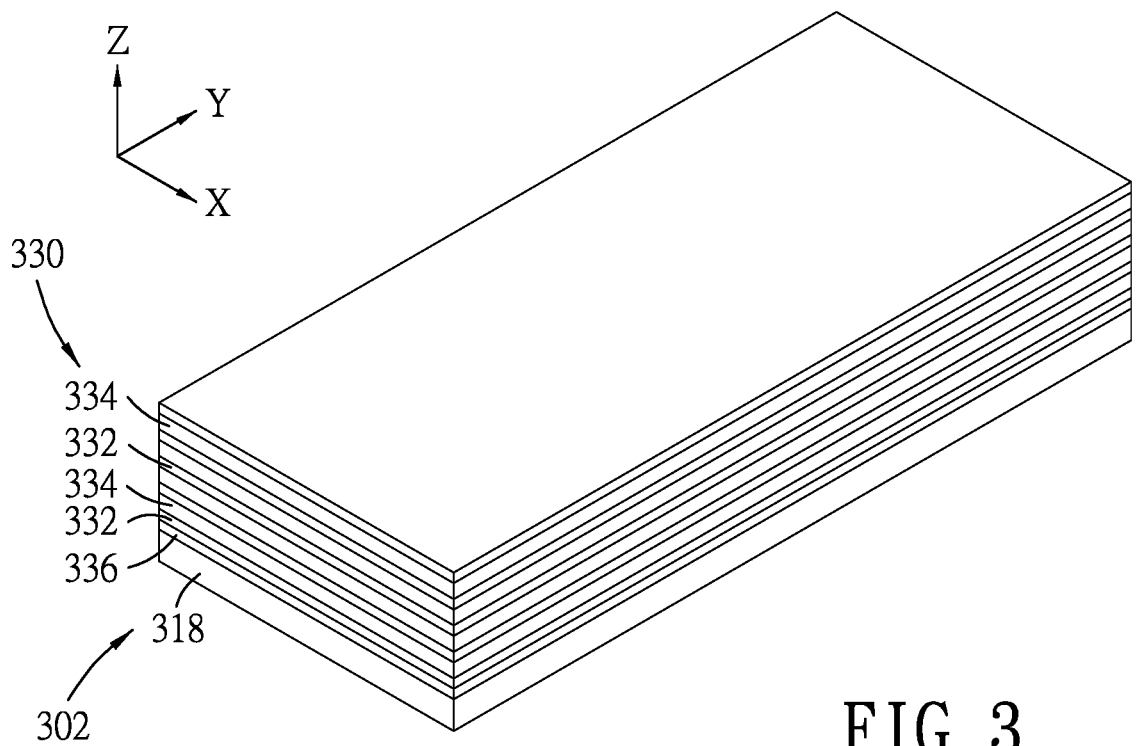
FIGS. 3 to 20 show intermediate steps of a method of making a semiconductor memory device in accordance with some embodiments.

Referring to FIG. 1A, in a step 204 of the method 200, a stack structure is formed. Referring to FIGS. 2 and 3, in some embodiments, the stack structure 330 is formed over the semiconductor structure 302, such as over the fourth ILD layer 318 of the semiconductor structure 302. A detailed structure of the semiconductor structure 302 is shown in FIG. 2 only, and is omitted in other figures for the sake of clarity.

In some embodiments, the stack structure 330 includes a plurality of first dielectric layers 332 and a plurality of second dielectric layers 334 that are alternatingly stacked over the semiconductor structure 302 along a Z direction that may be substantially perpendicular to the semiconductor substrate 304 of the semiconductor structure 302. In some embodiments, the semiconductor substrate 304 of the semiconductor structure 302 may extend parallel to an XY plane that are substantially perpendicular to each other and that are substantially perpendicular to the Z direction. In some embodiments, before forming the stack structure 330, a bottom etch stop layer 336 may be formed over the semiconductor structure 302, followed by forming the stack structure 330 over the bottom etch stop layer 336. In some embodiments, the first dielectric layers 332 may be made of silicon oxide, silicon nitride, silicon oxynitride, other suitable materials, or any combination thereof. In some embodiments, the first dielectric layers 332 may be made by CVD, PVD, ALD, other suitable techniques, or any combination thereof. In some embodiments, the second dielectric layers 334 may be made of silicon oxide, silicon nitride, silicon oxynitride, other suitable materials, or any combination thereof. In some embodiments, the second dielectric layers 334 may be made by CVD, PVD, ALD, other suitable techniques, or any combination thereof. In some embodiments, the second dielectric layers 334 may be made of a material that has a high etching selectivity with respect to the first dielectric layers 332. That is, for a suitable kind of etchant, the second dielectric layers 334 can be readily etched, while the first dielectric layers 332 are left slightly etched or substantially unetched. In some embodiments, the first and second dielectric layers 332, 334 may be made of a material that has a high etching selectivity with respect to the bottom etch stop layer 336. That is, for a suitable kind of etchant, the first and second dielectric layers 332, 334 can be readily etched, while the bottom etch stop layer 336 are left slightly etched or substantially unetched. In some embodiments, the first dielectric layers 332 may be made of an oxide-based material (e.g., silicon oxide, etc.), the second dielectric layers 334 may be made of a nitride-based material (e.g., silicon nitride, etc.), and the bottom etch stop layer 336 may be made of a carbide-based material (e.g., silicon carbide, etc.). As shown in FIG. 3, in some embodiments, one of the first dielectric layers 332 is disposed on the bottom etch stop layer 336, followed by forming one of the second dielectric layers 334 on the one of the first dielectric layer 332. But, in other embodiments, one of the second dielectric layers 334 may be first formed on the bottom etch stop layer 336, followed by forming one of the first dielectric layers 332 on the one of the second dielectric layers 334, according to practical requirements. Although FIG. 3 illustrates a specific number of the first and second dielectric layers 332, 334, the number of the first and second dielectric layers 332, 334 can be changed according to practical requirements. In addition, vertical thickness and horizontal width of the first and second dielectric layers 332, 334 are also changeable and may be determined according to practical requirements.

Figure 4:
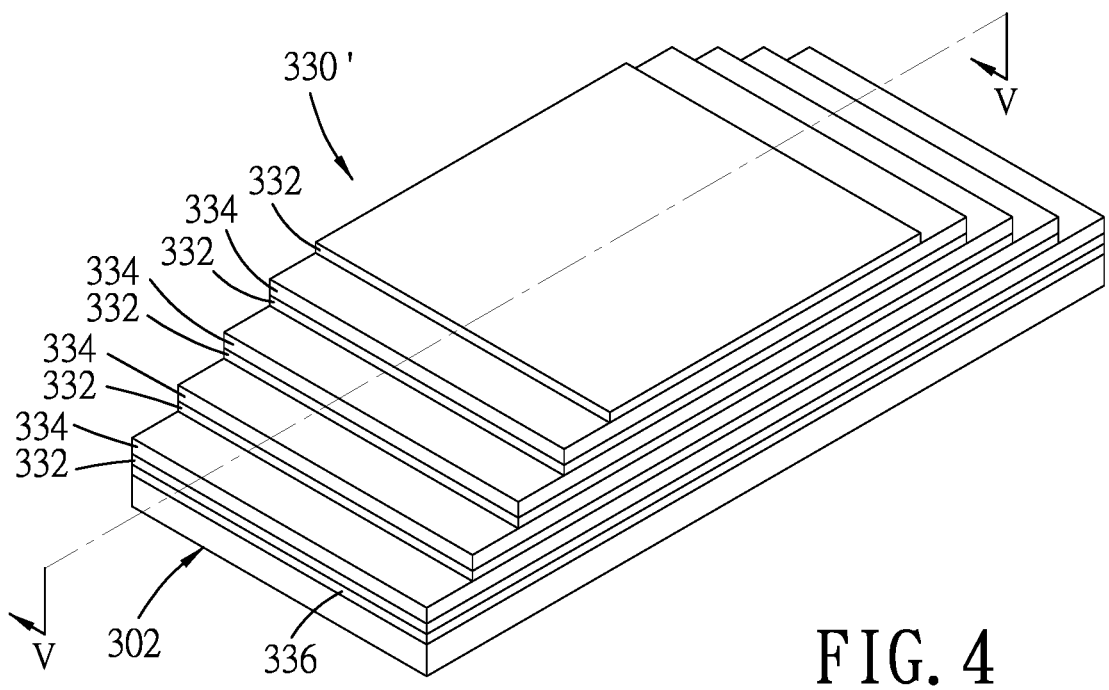
Figure 5:
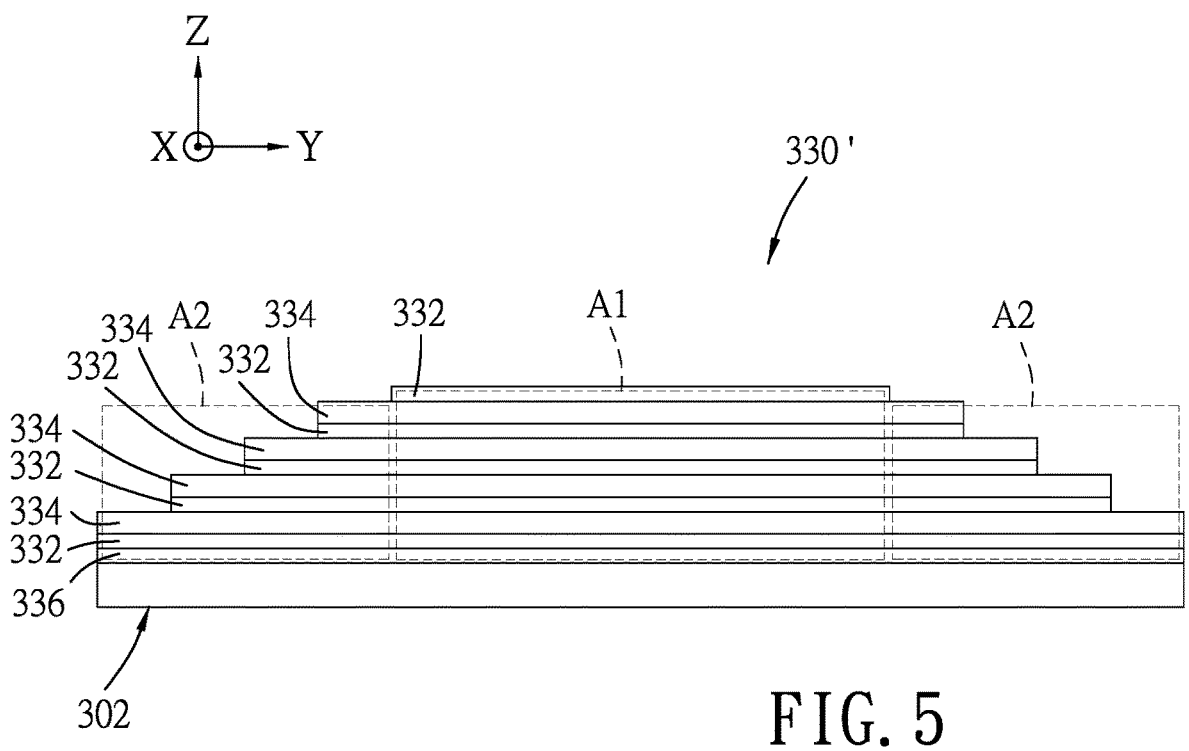

Referring to FIG. 1A, in a step 206 of the method 200, the stack structure is etched. In some embodiments, the stack structure 330 of FIG. 3 may be etched to form an etched stack structure 330' shown in FIG. 4, where FIG. 5 shows a schematic sectional view of the etched stack structure 330' taken from line V-V of FIG. 4. In some embodiments, the stack structure 330 may be etched using a plurality of etching processes, where each of the patterning processes may include forming a photoresist and/or a hard mask (not shown) over the stack structure 330, performing a lithographic process to pattern the photoresist and/or the hard mask, and performing an etching process to etch the first dielectric layer(s) 332 and/or the second dielectric layer(s) 334 through the patterned photoresist and/or the hard mask by dry etching, wet etching, other suitable techniques, or any combination thereof. As illustrated by FIGS. 4 and 5, the widths of the first dielectric layers 332 along the Y direction decrease relative to distance away from the semiconductor structure 302 (i.e., the widths decrease along the Z direction away from the semiconductor structure 302). Similarly, the widths of the second dielectric layers 334 along the Y direction decrease in the Z direction away from the semiconductor structure 302 (i.e., increase in the Z direction toward the semiconductor structure 302). In some embodiments, the etched stack structure 330' may include a main portion (A1) and two staircase portions (A2) that are connected to opposite sides of the main portion (A1) along the Y direction.

Figure 6:
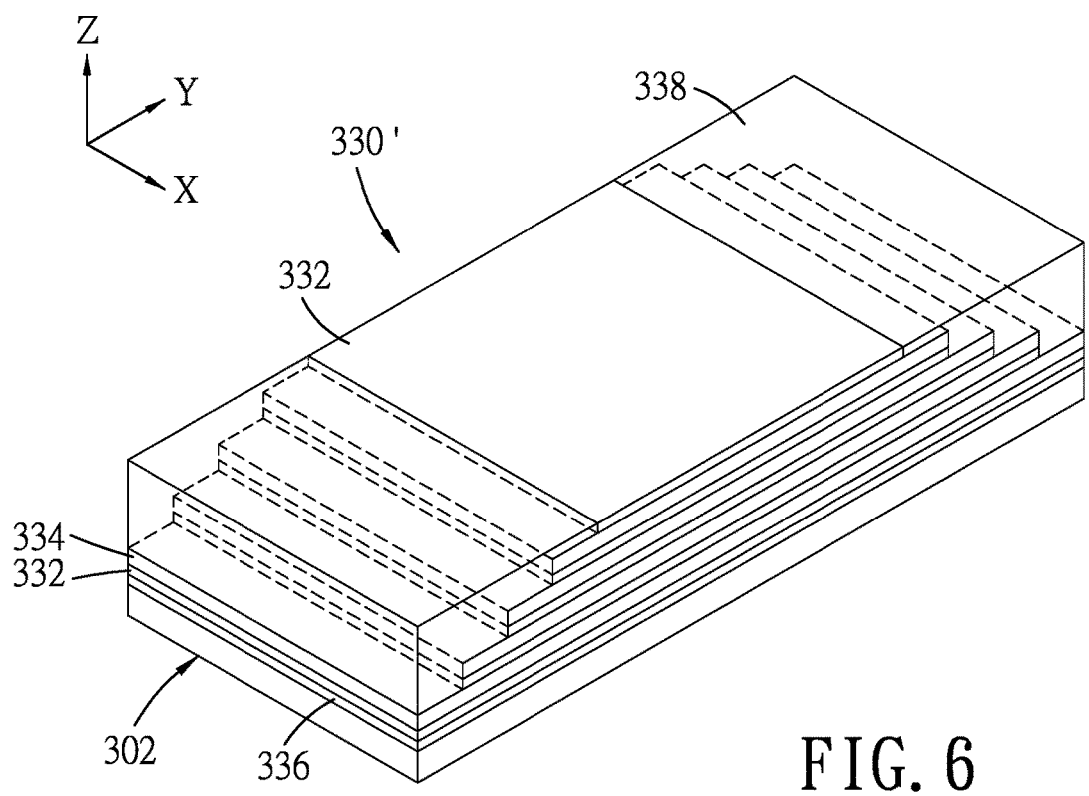

Referring to FIG. 1A, in a step 208 of the method 200, an inter-metal dielectric layer is formed. Referring to FIGS. 5 and 6, in some embodiments, the inter-metal dielectric layer 338 is formed to cover the staircase portions (A2) of the etched stack structure 330' where the main portion (A1) of the etched stack structure 330' is exposed from the inter-metal dielectric layer 338. In some embodiments, the inter-metal dielectric layer 338 may be made of a material that includes silicon oxide, USG, PSG, BSG, BPSG, FSG, other suitable materials, or any combination thereof. In some embodiments, the inter-metal dielectric layer 338 may be made by spin coating, CVD (including FCVD, PECVD, LPCVD, etc.), other suitable techniques, or any combination thereof. In some embodiments, the inter-metal dielectric layer 338 may be made by first forming a suitable dielectric material to cover the main portion (Al) and the staircase portions (A2) of the etched stack structure 330', and then removing a portion of the suitable dielectric material by chemical mechanical planarization (CMP), etch back, other suitable techniques, or any combination thereof to expose the main portion (A1). In some embodiments, a top surface of the inter-metal dielectric layer 338 may be level with a top surface of the main portion (A1) of the etched stack structure 330'.

Figure 7:
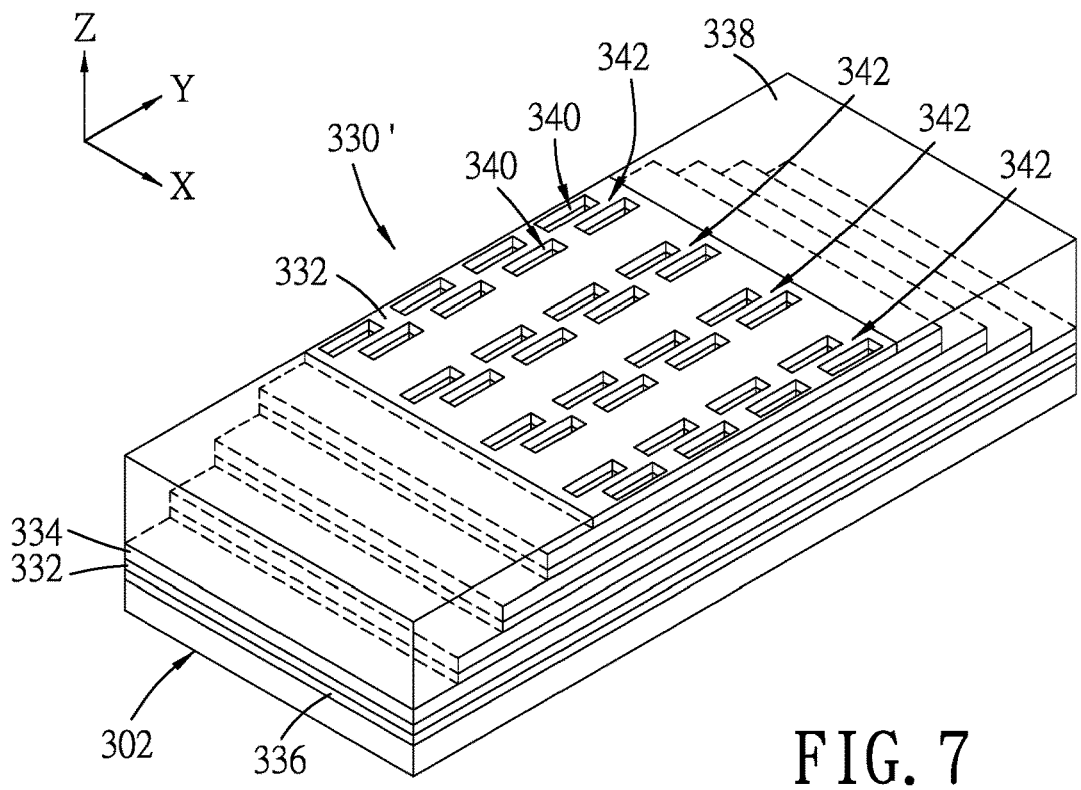

Referring to FIG. 1A, in a step 210 of the method 200, a plurality of trenches are formed. Referring to FIGS. 5 and 7, in some embodiments, the trenches 340 are formed in the main portion (A1) of the etched stack structure 330' outside of the staircase portions (A2) of the etched stack structure 330'. In some embodiments, the trenches 340 may be formed by reactive ion etching (RIE), neutral beam etching (NBE), wet etching, other suitable techniques, or any combination thereof. In some embodiments, each of the trenches 340 substantially extends in the Z direction, penetrates the first and second dielectric layers 332, 334, and terminates at the bottom etch stop layer 336. In some embodiments, the trenches 340 are arranged into multiple groups 342, where the trenches 340 in each group 342 are arranged in two rows substantially extending in the Y direction, and the trenches 340 in each group 342 are misaligned with each other in the X direction. In other embodiments, the trenches 340 in each group 342 may be aligned with each other in the X direction. The dimension of each of the trenches 340 may be determined according to practical requirements.

Figure 8:
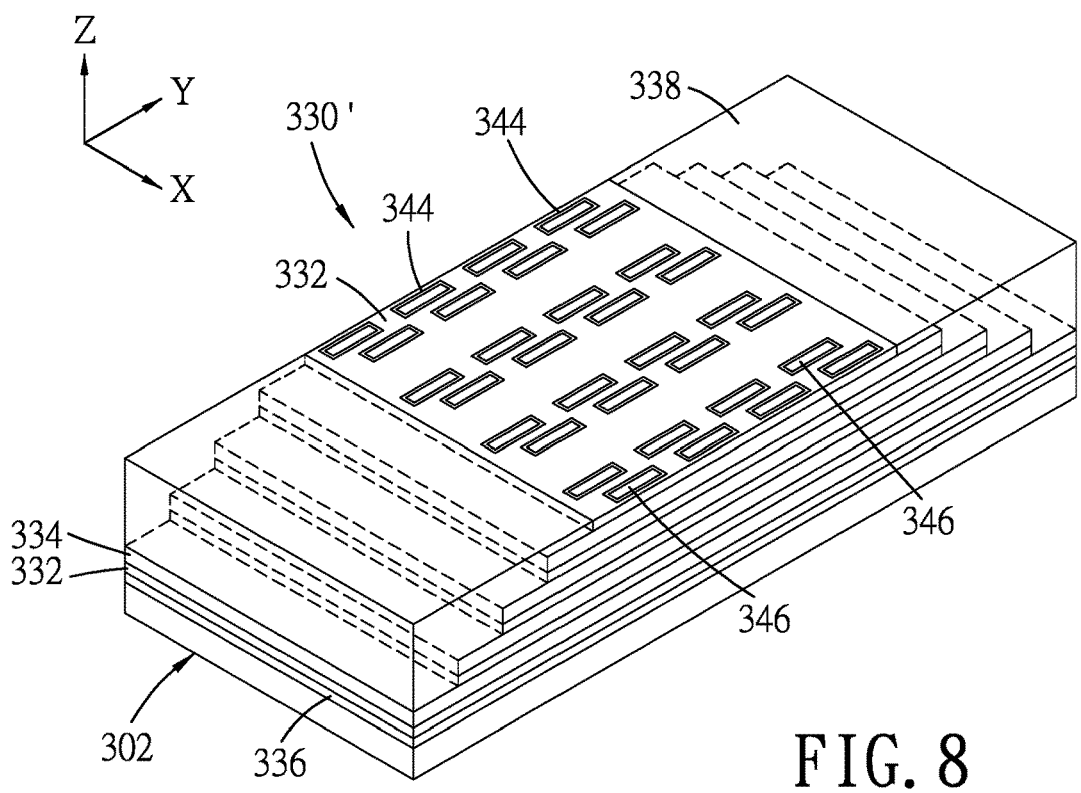

Referring to FIG. 1A, in a step 212 of the method 200, a plurality of channel segments and a plurality of isolation segments are formed. Referring to FIG. 8, in some embodiments, the channel segments 344 are respectively formed in the trenches 340 (see FIG. 7) (e.g., respectively formed on sidewalls that respectively define the trenches 340), and the isolation segments 346 are respectively formed in the trenches 340 and are respectively surrounded by the channel segments 344. In some embodiments, the channel segments 344 and the isolation segments 346 may be made by: depositing a layer of channel material in the trenches 340, on the topmost first dielectric layer 332, and on the inter-metal dielectric layer 338, depositing a layer of isolation material to fill the trenches 340 and over the topmost first dielectric layer 332 and the inter-metal dielectric layer 338, and removing the channel material and the isolation material over the topmost first dielectric layer 332 and the inter-metal dielectric layer 338 to form the channel segments 344 and the isolation segments 346. In some embodiments, the channel material may be deposited by ALD, CVD, PVD, other suitable techniques, or any combination thereof. In some embodiments, the isolation material may be deposited by ALD, CVD, PVD, other suitable techniques, or any combination thereof. In some embodiments, the process of removing the channel material and the isolation material may be conducted by CMP, etch back, other suitable techniques, or any combination thereof. In some embodiments, the channel segments 344 may be first formed (i.e., depositing the channel material and removing a portion of the channel material to form the channel segments 344), followed by forming the isolation segments 346 (i.e., depositing the isolation material and removing a portion of the isolation material to form the isolation segments 346). In some embodiments, each of the channel segments 344 (i.e., the channel material) may include elemental semiconductor, oxide semiconductor, compound semiconductor (including group III-V semiconductors, group II-VI semiconductors, or the like), IgZO, ZnO, IWO, other suitable materials, or any combination thereof. In some embodiments, the isolation segments 346 (i.e., the isolation material) may include SiO, SiN, SiON, SiOC, SiCN, other suitable materials, or any combination thereof.

Figure 9:
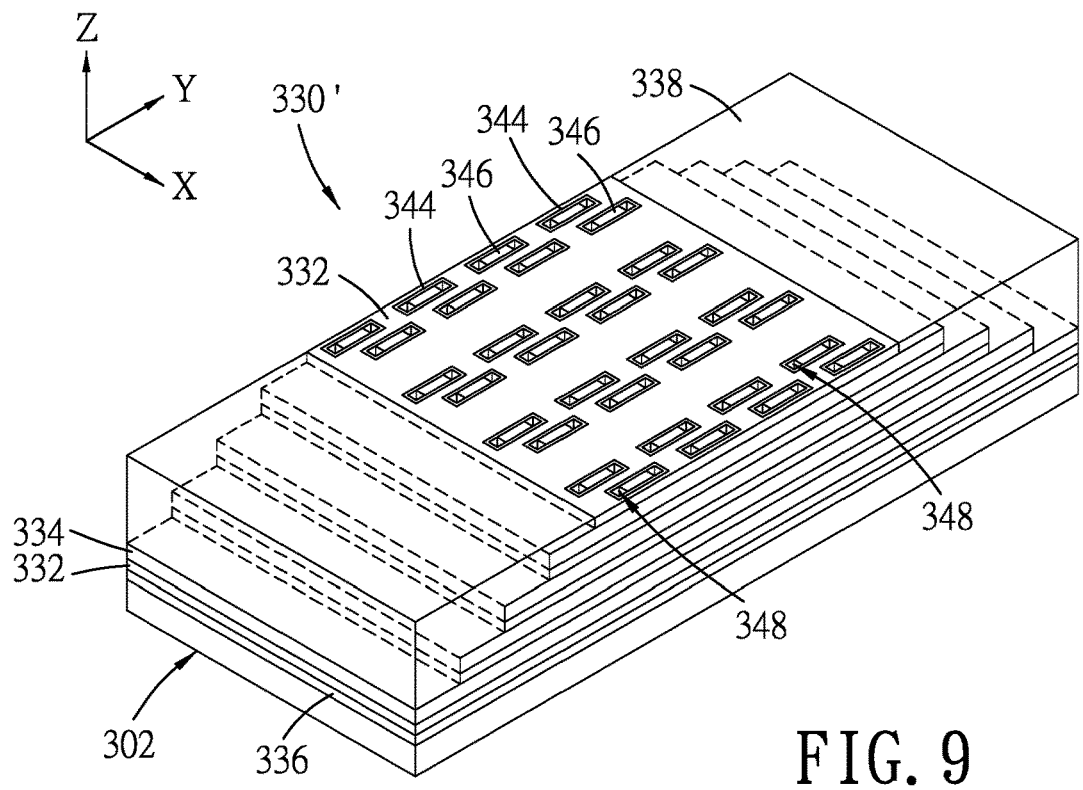

Referring to FIG. 1A, in a step 214 of the method 200, a plurality of holes are formed. Referring to FIG. 9, in some embodiments, the holes 348 are formed in the isolation segments 346. In some embodiments, each of the isolation segments 346 is formed with corresponding two of the holes 348 that are separated from each other in the Y direction by the remaining portion of the isolation segment 346 and that are communicated with a corresponding one of the channel segments 344 surrounding the corresponding two of the holes 348 and the remaining portion of the isolation segment 346. In some embodiments, each of the holes 348 may be formed by RIE, NBE, wet etching, other suitable techniques, or any combination thereof. The dimension of each of the holes 348 may be determined according to practical requirements.

Figure 10:
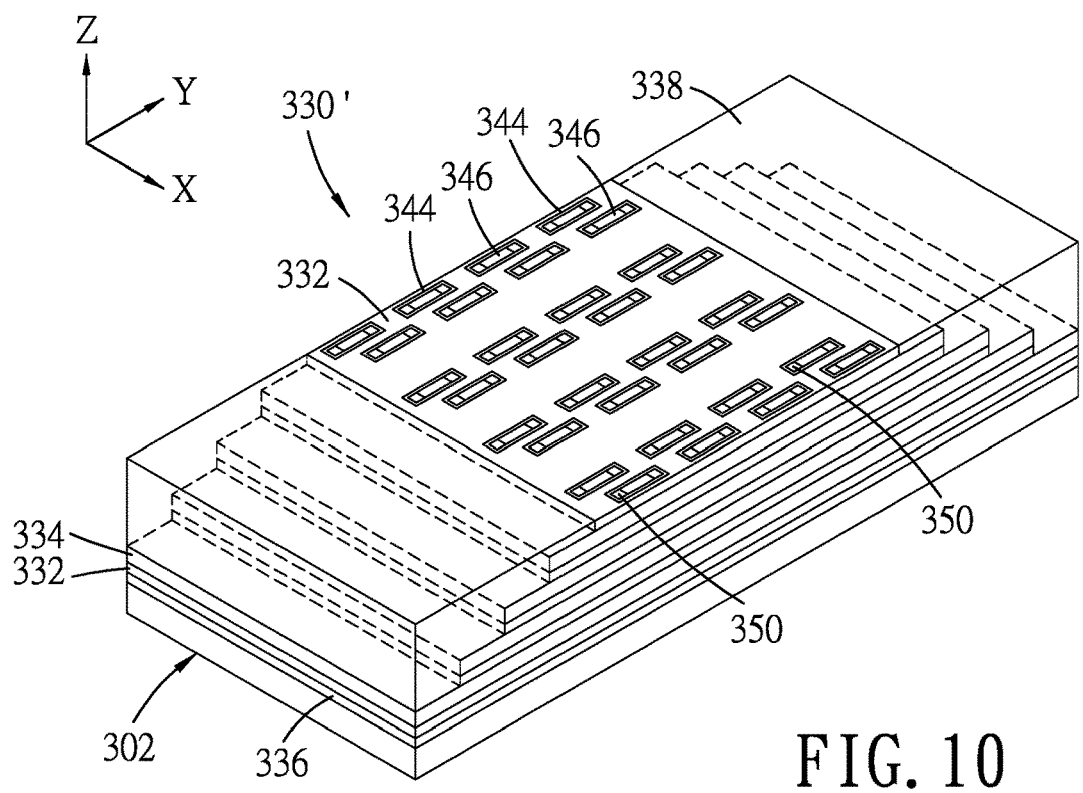

Referring to FIG. 1A, in a step 216 of the method 200, a plurality of conductive lines are formed. Referring to FIG. 10, in some embodiments, the conductive lines 350 are respectively formed in the holes 348 (see FIG. 9), where each of the conductive lines 350 is connected to a corresponding one of the channel segments 344. In some embodiments, a conductive material may be deposited in the holes 348, over the topmost first dielectric layer 332, and over the inter-metal dielectric layer 338, followed by removing the conductive material over the topmost first dielectric layer 332 and the inter-metal dielectric layer 338, thereby obtaining the conductive lines 350. In some embodiments, the conductive material may be formed by CVD, PVD, ALD, other suitable techniques, or any combination thereof. In some embodiments, the process of removing the conductive material may be conducted by CMP, etch back, other suitable techniques, or any combination thereof. In some embodiments, each of the conductive lines 350 (i.e., the conductive material) may include a suitable conductive material, such as polysilicon (doped or undoped), silicide (TiSi, CoSi, SiGe or the like), oxide semiconductor (InZnO, InGaZnO or the like), metal (Al, Cu, W, Ti, Co, Ni, Ru, TiN, TaN, TaAlN or the like), any combination thereof, or the like.

Figure 11:
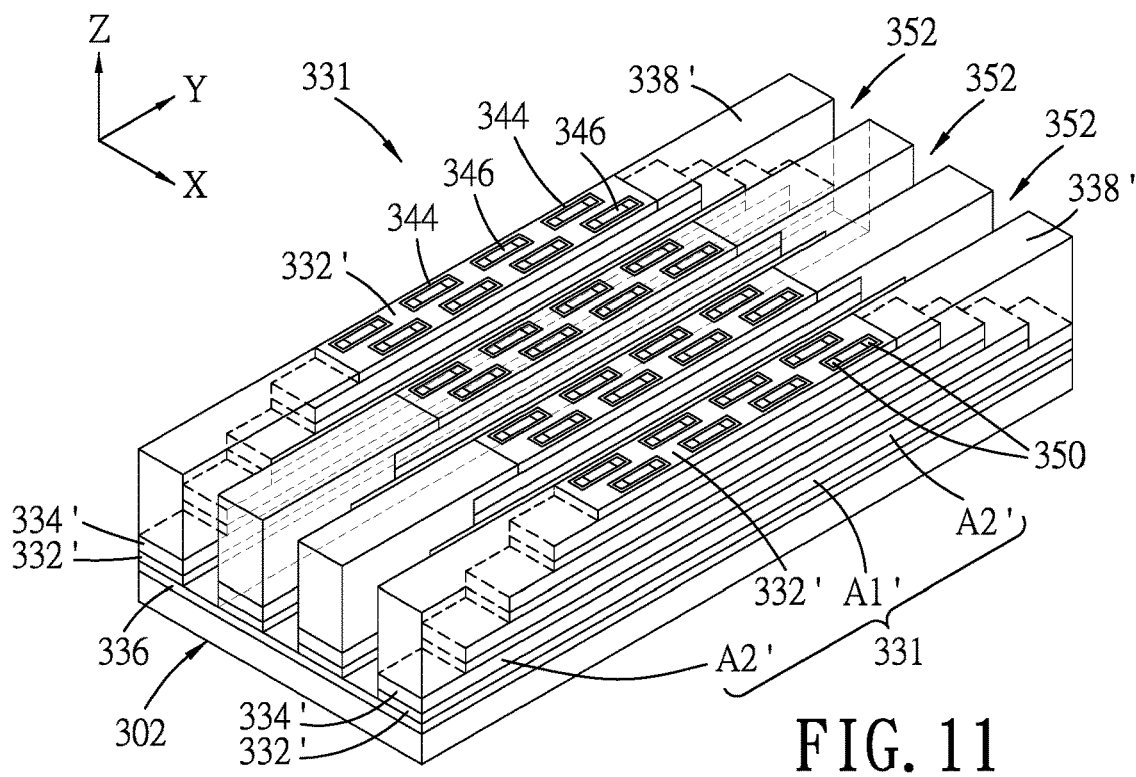

Referring to FIG. 1B, in a step 218 of the method 200, a plurality of slits are formed. Referring to FIGS. 10 and 11, in some embodiments, the slits 352 are formed to penetrate the etched stack structure 330' and the inter-metal dielectric layer 338 and to terminate at the bottom etch stop layer 336. The etched stack structure 330' is etched into a plurality of stack segments 331 each including a main part (A1') and two staircase parts (A2') that are connected to opposite sides of the main part (A1') along the Y direction (i.e., each of the first dielectric layers 332 is etched into a plurality of first dielectric segments 332', and each of the second dielectric layers 334 is etched into a plurality of second dielectric segments 334'). The inter-metal dielectric layer 338 is etched into a plurality of inter-metal dielectric segments 338' each covering the staircase parts (A2') of a respective one of the stack segments 331, and where the channel segments 344, the isolation segments 346 and the conductive lines 350 are unetched.

Figure 12:
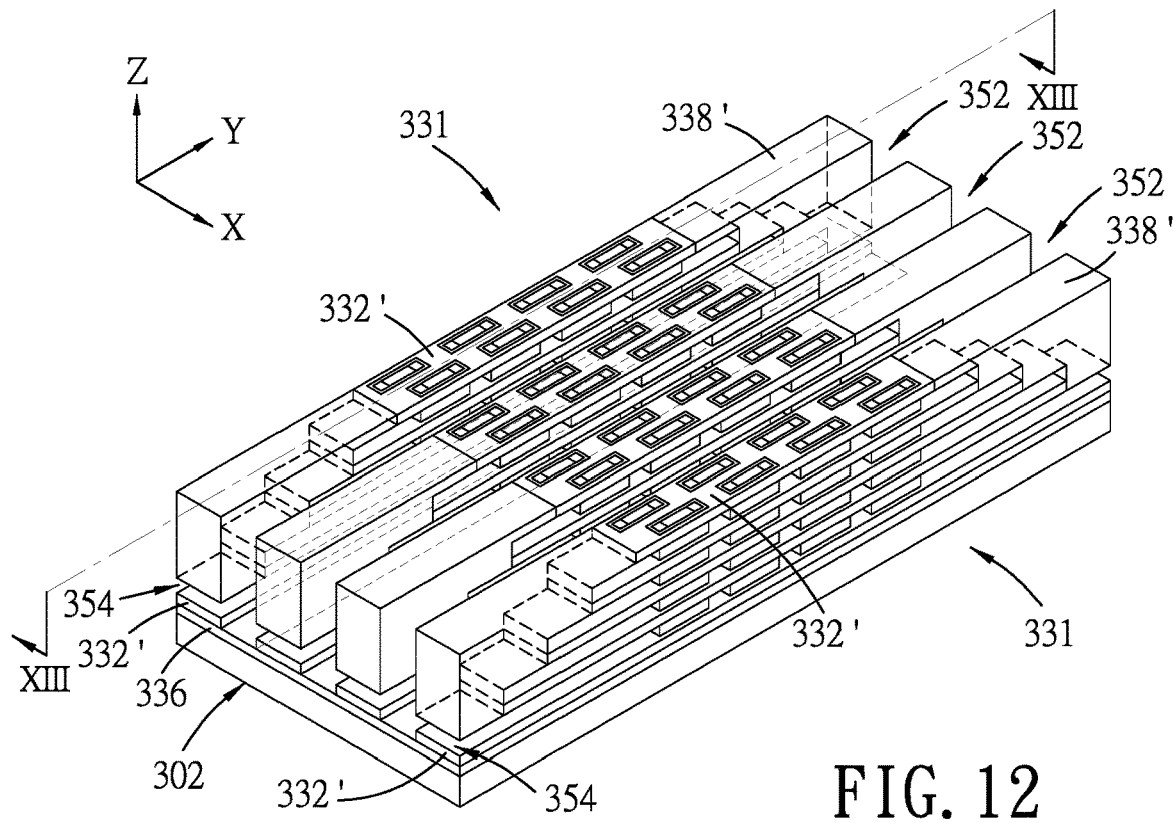
Figure 13:
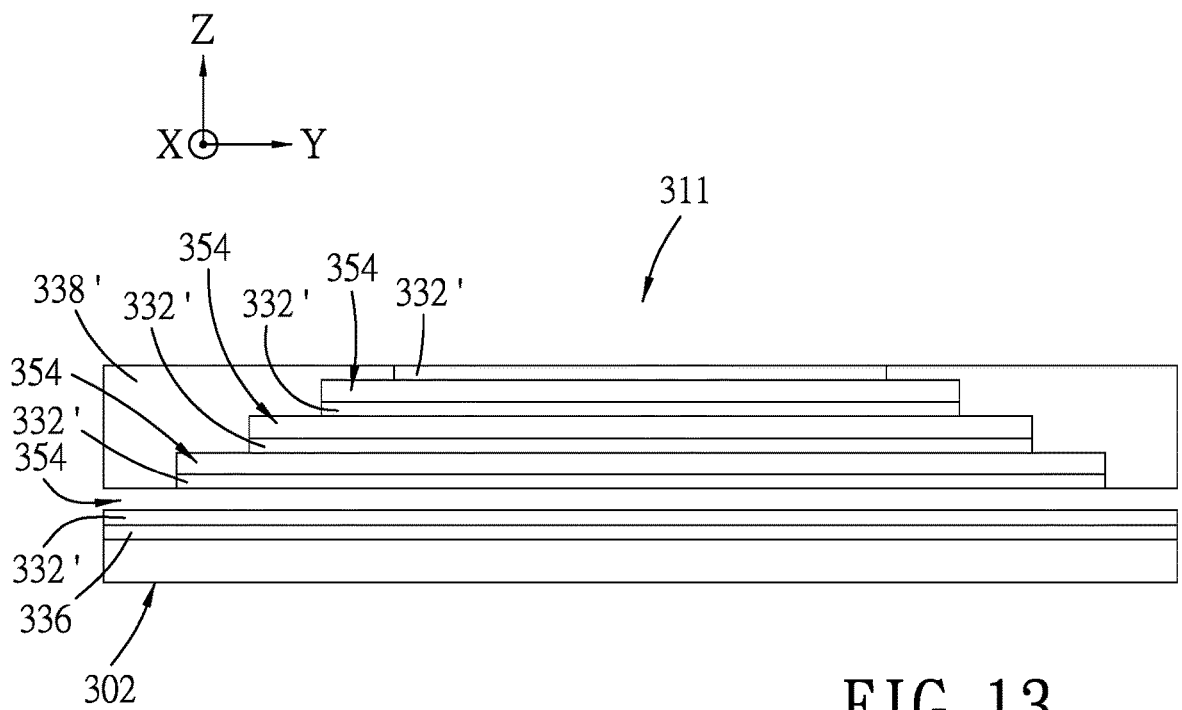

Referring to FIG. 1B, in a step 220 of the method 200, the second dielectric segments are removed. Referring to FIGS. 11 to 13, in some embodiments, the second dielectric segments 334' are removed to form a plurality of spaces 354. In some embodiments, the second dielectric segments 334' may be removed by wet etching (e.g., using $H_3PO_4$, etc.), other suitable techniques, or any combination thereof, while the first dielectric segments 332' are substantially unetched or only slightly etched.

Figure 14:
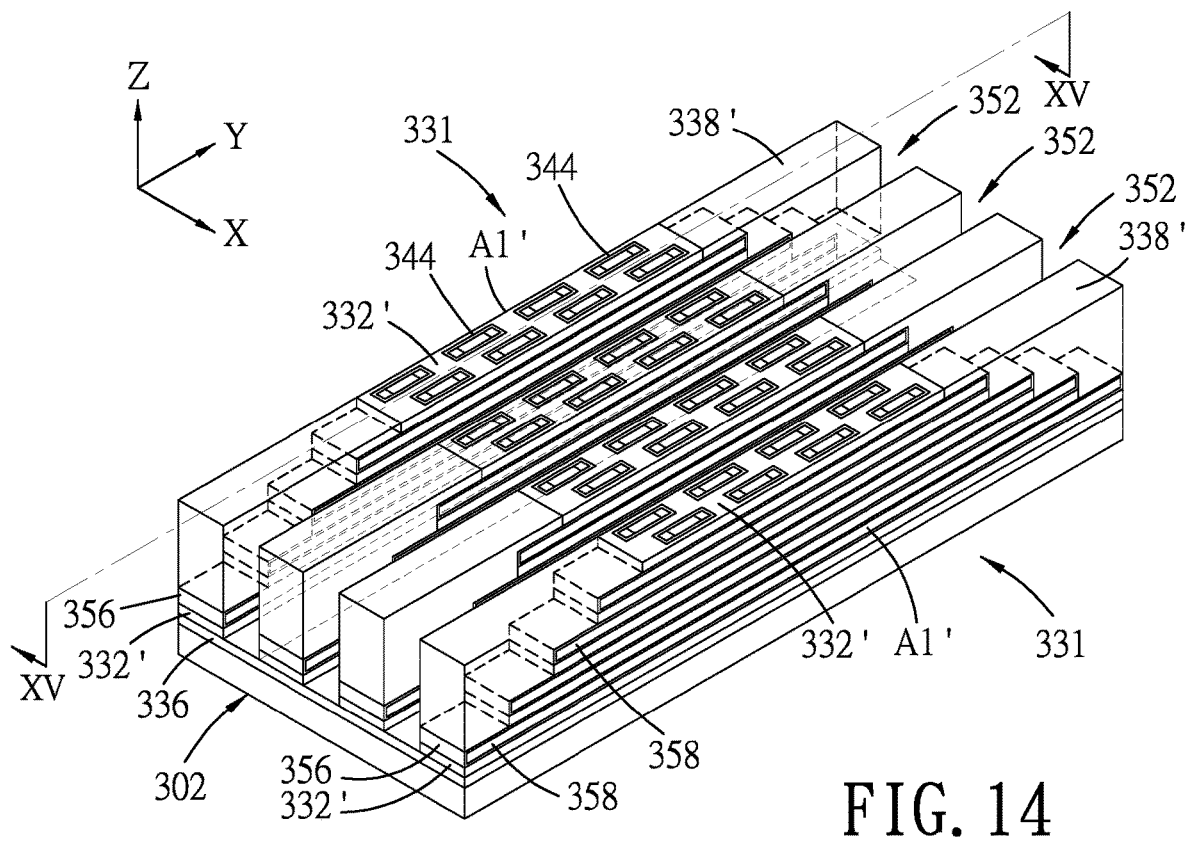
Figure 15:
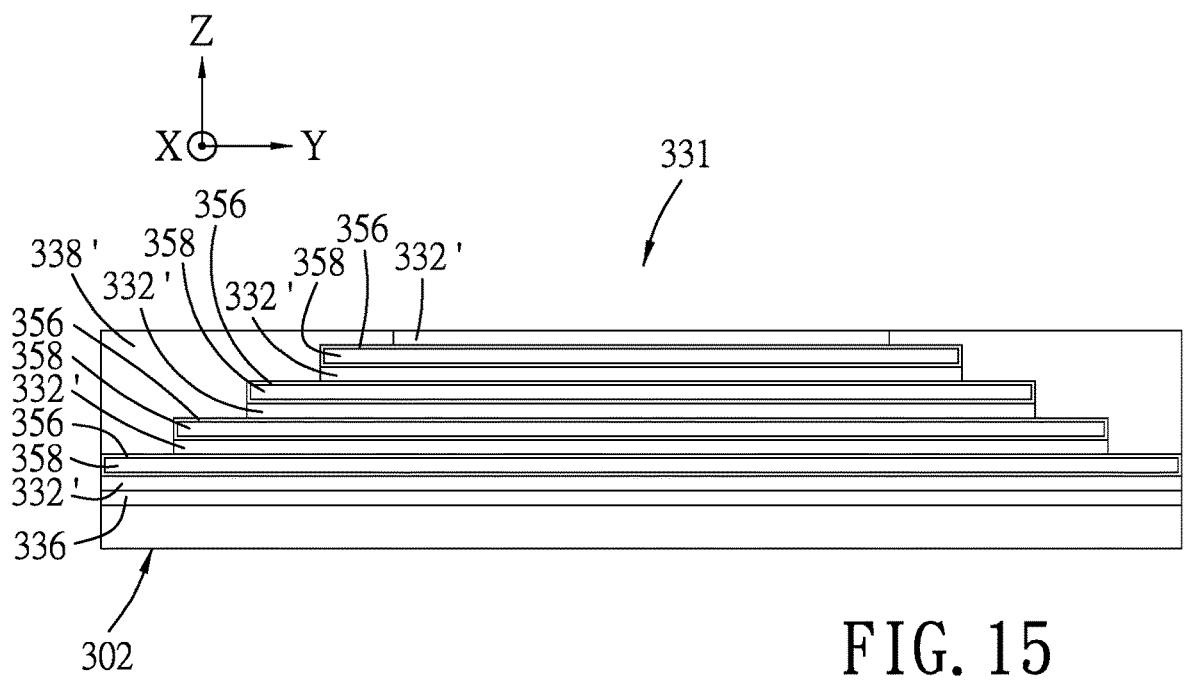

Referring to FIG. 1B, in a step 222 of the method 200, a plurality of memory segments are formed. Referring to FIGS. 14 and 15, in some embodiments, a memory material is conformally deposited in the spaces 354 (see FIGS. 12 and 13), on the channel segments 344 exposed from the spaces 354 and the slits 352, in the slits 352, on the main parts (A1') of the stack segments 331, and on the inter-metal dielectric segments 338', followed by removing the memory material in the slits 352, on the main parts (A1') of the stack segments 331 and on the inter-metal dielectric segments 338' to form the memory segments 356 in the spacers 354 and surrounding the channel segments 344 once exposed from the spaces 354 and the slits 352. In some embodiments, the memory material may be formed by ALD, CVD, other suitable techniques, or any combination thereof. In some embodiments, the removal of the memory material may be conducted using dry etching, wet etching, other suitable techniques, or any combination thereof. In some embodiments, the memory material (i.e., the memory segments 356) may be made of a ferroelectric material, such as $HfO_2$, $HfSiO_x$, $HfZrO_x$ (HZO), $PbZrTiO_x$ (PZT), $BaSrTiO_x$ (BST), $Al_2O_3$, $TiO_2$, $LaO_x$, other suitable materials, or any combination thereof, may be a charge trapping layer such as an ONO (oxide-nitride-oxide) trilayer, or may be other suitable memory layers.

Referring to FIG. 1B, in a step 224 of the method 200, a plurality of conductive segments are formed. Referring to FIGS. 14 and 15, in some embodiments after the formation of the memory segments 356, a conductive material is deposited to fill the spaces 354, in the slits 352, on the main parts (A1') of the stack segments 331, and on the inter-metal dielectric segments 338', followed by removing the conductive material in the slits 352, on the main parts (A1') of the stack segments 331 and on the inter-metal dielectric segments 338' to form the conductive segments 358 in the spacers 354. In some embodiments, the conductive material may be formed by ALD, CVD, other suitable techniques, or any combination thereof. In some embodiments, the removal of the conductive material may be conducted using dry etching, wet etching, other suitable techniques, or any combination thereof. In some embodiments, the conductive material (i.e., the conductive segments 358) may include a suitable conductive material, such as polysilicon (doped or undoped), silicide (TiSi, CoSi, SiGe or the like), oxide semiconductor (InZnO, InGaZnO or the like), metal (Al, Cu, W, Ti, Co, Ni, Ru, TiN, TaN, TaAlN or the like), any combination thereof, or the like.

In some embodiments, the memory segments 356 and the conductive segments 358 may be made by: depositing the memory materials in the spaces 354, on the channel segments 344 exposed from the spaces 354 and the slits 352, in the slits 352, on the main parts (A1') of the stack segments 331, and on the inter-metal dielectric segments 338'; depositing the conductive material on the memory materials (i.e., the conductive material is deposited to fill the spaces 354, in the slits 352, on the main parts (A1') of the stack segments 331, and on the inter-metal dielectric segments 338'); and removing the memory material and the conductive material in the slits 352, on the main parts (A1') of the stack segments 331 and on the inter-metal dielectric segments 338' to obtain the memory segments 356 and the conductive segments 358.

Figure 16:
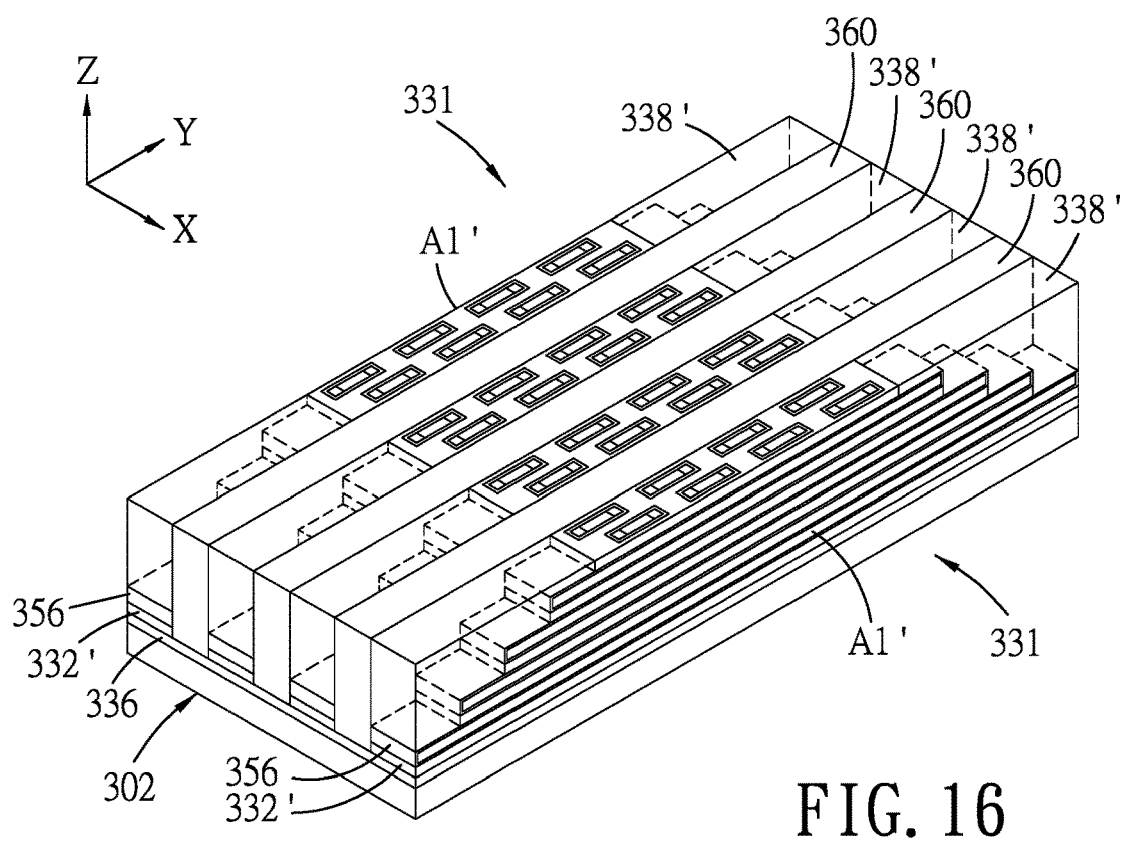

Referring to FIG. 1B, in a step 226 of the method 200, a plurality of isolation features are formed. Referring to FIG. 16, in some embodiments, the isolation features 360 are formed to respectively fill the slits 352 (see FIG. 14). In some embodiments, an isolation material is deposited to fill the slits and over the main parts (A1') of the stack segments 331 and the inter-metal dielectric segments 338', followed by removing the isolation material formed over the main parts (A1') of the stack segments 331 and the inter-metal dielectric segments 338' to obtain the isolation features 360. In some embodiments, the isolation material may be deposited by CVD, ALD, PVD, other suitable techniques, or any combination thereof. In some embodiments, the isolation material (i.e., the isolation features 360) may include SiO, SiN, SiON, SiOC, SiCN, other suitable materials, or any combination thereof. In some embodiments, the process of removing the isolation material may be conducted by CMP, etch back, other suitable techniques, or any combination thereof.

Figure 17:
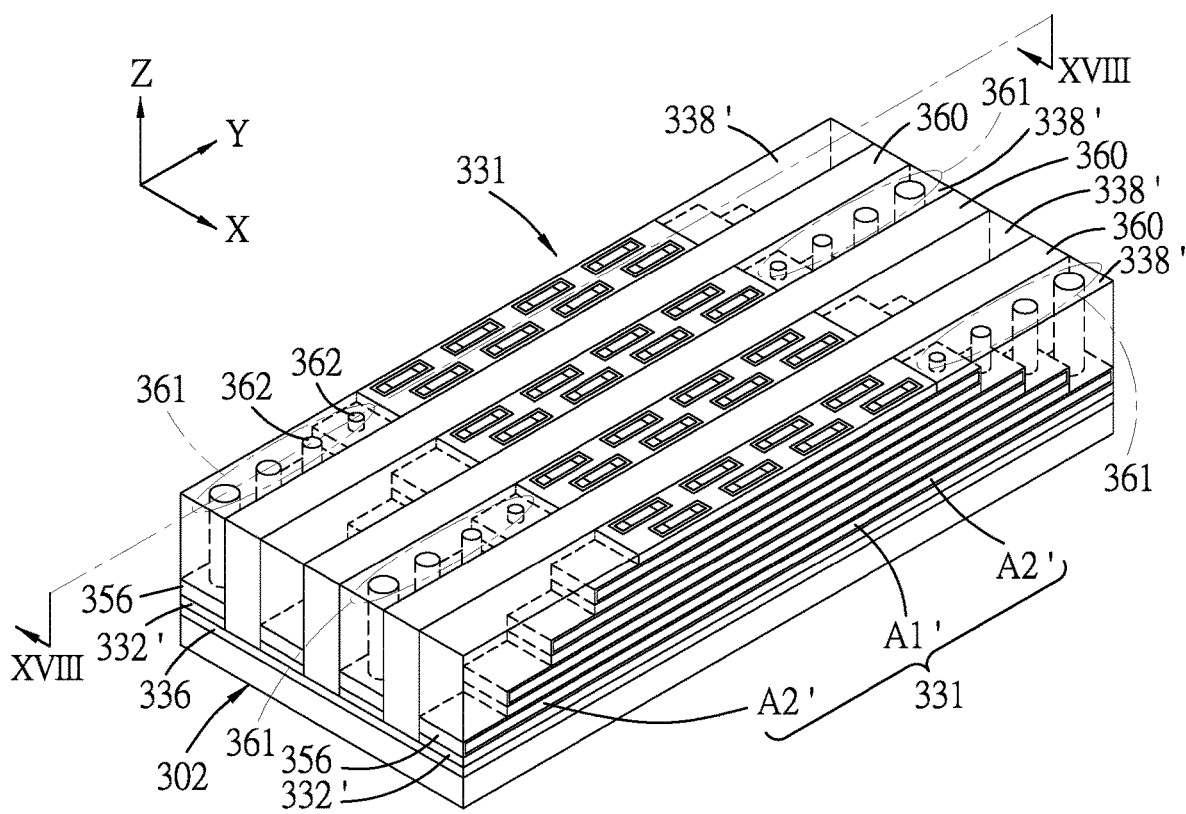
Figure 18:
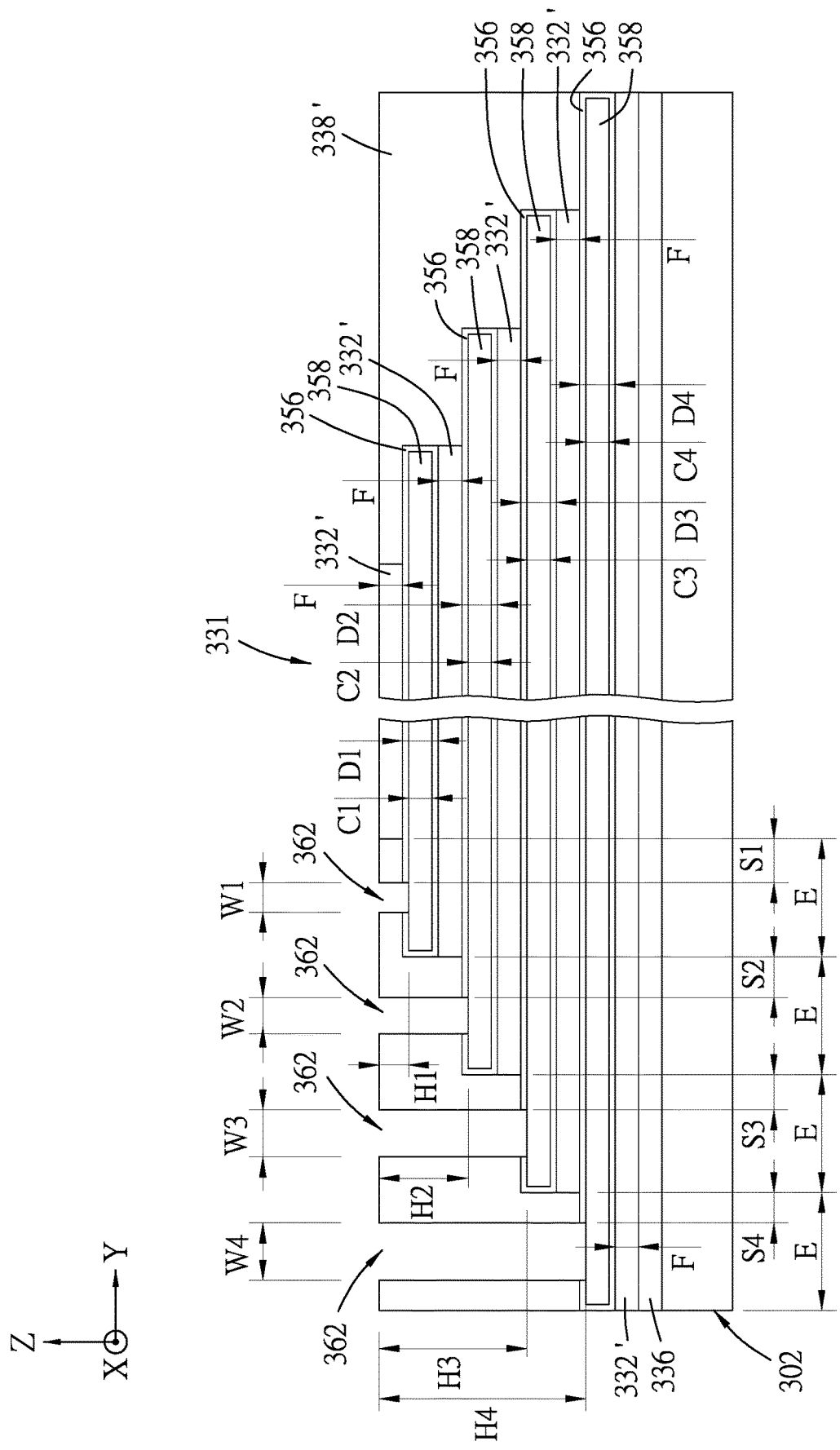

Referring to FIG. 1B, in a step 228 of the method 200, a plurality of staircase via holes are formed. Referring to FIGS. 17 and 18, in some embodiments, each of the staircase via holes 362 is formed in a corresponding one of the inter-metal dielectric segments 338', penetrates a corresponding one of the memory segments 356, and terminates at a corresponding one of the conductive segments 358. In some embodiments, the staircase via holes 362 may be formed by RIE, NBE, wet etching, other suitable techniques, or any combination thereof. In some embodiments, each of the staircase via holes 362 may be formed in the corresponding one of the inter-metal dielectric segments 338' and terminates at the corresponding one of the memory segments 356 (i.e., the corresponding one of the memory segments 356 serves as an etch stop layer for the formation of the staircase via hole 362), followed by extending the staircase via hole 362 through the corresponding one of the memory segments 356.

As shown in FIG. 17, in some embodiments, the staircase via holes 362 may be arranged into four groups 361, where each group 361 is formed in a respective one of the inter-metal dielectric segments 338'.

Referring to FIG. 18, in each group 361, the widths (W1 to W4) and heights (H1 to H4) of the staircase via holes 362 increase in a direction substantially parallel to the Y direction and away from the stack segment 331 shown in FIG. 18. In some embodiments, the concept of etch loading effect may be adopted to the formation of the staircase via holes 362. That is, in a single etching step, a larger opening would result in deeper etching depth since more etchant can enter the larger opening. In some embodiments, the widths (W1 to W4) of the staircase via holes 362 may be in 10% increments in the direction away from the stack segment 331, but other increment values are also possible according to practical requirements. That is, a ratio of (W2−W1)/W1=0.1. In some embodiments of this disclosure, the width of a widest one of the staircase via holes may be up to five times the width of a narrowest one of the staircase via holes, but the ratio between the widest and narrowest staircase via holes may be changed according to practical requirements. In some embodiments, the width (W1 to W4) of each of the staircase via holes 362 may range from about 10 nm to about 1000 nm, but other ranges of values are also within the scope of this disclosure. In some embodiments, the width (W1 to W4) of each of the staircase via holes 362 may range from about 10 nm to about 50 nm, from about 50 nm to about 100 nm, from about 100 nm to about 150 nm, from about 150 nm to about 200 nm, from about 200 nm to about 250 nm, from about 250 nm to about 300 nm, from about 300 nm to about 350 nm, from about 350 nm to about 400 nm, from about 400 nm to about 450 nm, from about 450 nm to about 500nm, from about 500 nm to about 550 nm, from about 550 nm to about 600 nm, from about 600 nm to about 650 nm, from about 650 nm to about 700 nm, from about 750 nm to about 800 nm, from about 800 nm to about 850 nm, from about 850 nm to about 900 nm, from about 900 nm to about 950 nm, from about 950 nm to about 1000 nm, or may be in other suitable ranges. In some embodiments, if the width (W1 to W4) of each of the staircase via holes 362 is too small, such as smaller than about 10 nm, it can be harder to evenly form a conductive via in the staircase via hole 362 or the resistance of the resulting conductive via would be undesirably high. In some embodiments, if the width (W1 to W4) of each of the staircase via holes 362 is too large, such as larger than about 1000 nm, the dimension of the resulting conductive via would be undesirably large. In some embodiments, each of the memory segments 356 extends a distance (E) beyond a corresponding one of the first dielectric segments 332' thereabove, and the width (W1 to W4) of each of the staircase via holes 362 is smaller than the distance (E) of the corresponding one of the memory segments 356 that the staircase via hole 362 extends through. That is, each of the staircase via holes 362 is separated from an adjacent one of the first dielectric segments 332' by a distance (S1 to S4). In some embodiments, a center point of each of the staircase via holes 362 may be located at a center point of the distance (E) of a corresponding one of the memory segments 356. In some embodiments, the distances (S1 to S4) may be equal to each other, or may decrease away from the stack segment 331 (i.e., S1>S2>S3>S4). In some embodiments, a thickness (C1 to C4) of each of the conductive segments 358 is equal to a thickness (F) of each of the first dielectric segments 332'. But, in other embodiments, a thickness (D1 to D4), which is calculated by adding up two times the thickness of each of the memory segments 356 and the thickness (C1 to C4) of a corresponding one of the conductive segments 358 surrounded by the memory segment 356, may be equal to the thickness (F) of each of the first dielectric segments 332'. In some embodiments, since the conductive segment 358 closer to the semiconductor structure 302 is greater in length (i.e., a lower conductive segment 358 extends horizontally beyond/further than a higher conductive segment 358) and hence has higher resistance, the thickness (C1 to C4) of each of the conductive segments 358 may increase toward the semiconductor structure 302 to compensate for the increase in resistance. In some embodiments, each of the staircase via holes 362 has a height (H1 to H4) ranging from about 100 nm to about 5µm, but other ranges of values are also within the scope of this disclosure. In some embodiments, if the height (H1 to H4) of each of the staircase via holes 362 is too small, such as smaller than about 100 nm, the resistance of the resulting conductive via formed therein may be undesirably high. In some embodiments, if the height (H1 to H4) of each of the staircase via holes 362 is too large, the aspect ratio of the staircase via hole 362 may be too high, making it difficult to form the conductive via therein. Any dimensions described in this disclosure may be changed according to practical requirements.

As shown in FIG. 18, in some embodiments, each of the staircase via holes 362 has a substantially rectangular cross-section. However, in other embodiments, each of the staircase via holes 362 may have a tapered cross-section, such as an inverted trapezoid cross-section, or other suitable cross-sections.

Figure 19:
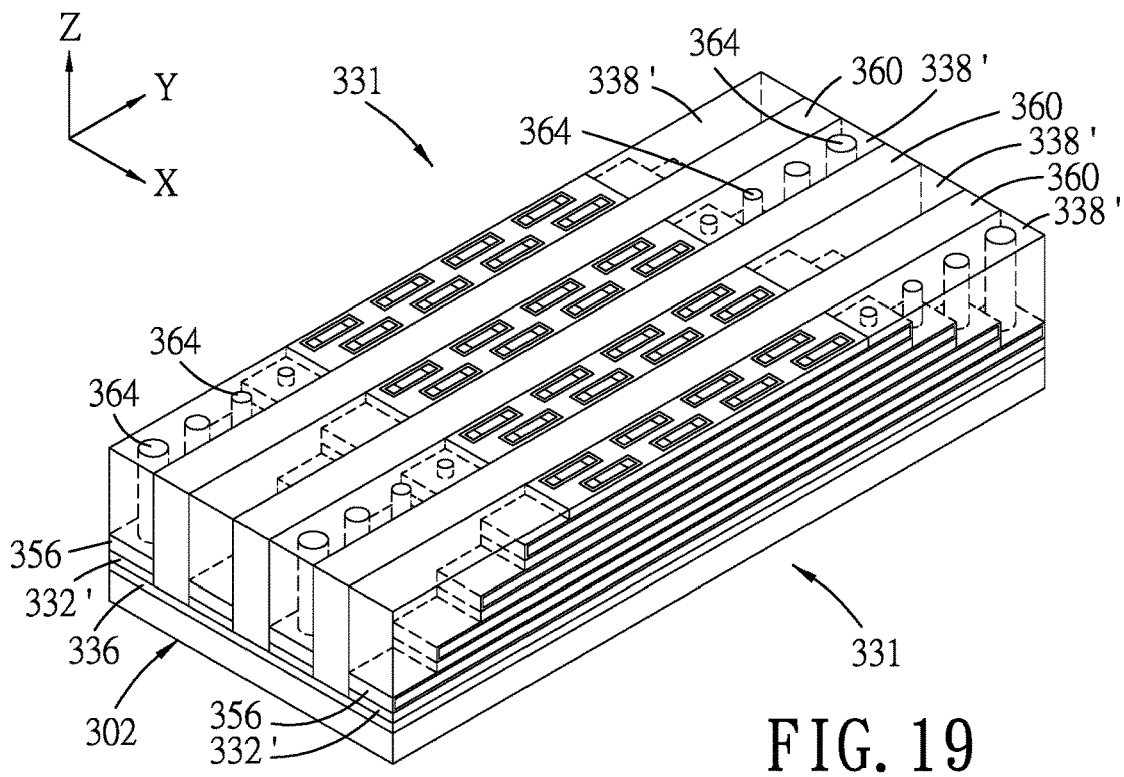

Referring to FIG. 1B, in a step 230 of the method 200, a plurality of staircase vias are formed. Referring to FIGS. 19, in some embodiments, the staircase vias 364 are respectively formed in the staircase via holes 362 (see FIGS. 17 and 18). In some embodiments, a conductive material may be deposited in the staircase via holes 362, over the stack segments 331, and over the inter-metal dielectric segments 338', followed by removing the conductive material over the stack segments 331 and the inter-metal dielectric segments 338', thereby obtaining the staircase vias 364. In some embodiments, the conductive material may be formed by CVD, PVD, ALD, plating, other suitable techniques, or any combination thereof. In some embodiments, the process of removing the conductive material may be conducted by CMP, etch back, other suitable techniques, or any combination thereof. In some embodiments, each of the staircase vias 364 (i.e., the conductive material) may include a suitable conductive material, such as Al, Cu, W, Ti, Co, Ni, Ru, TiN, TaN, TaAlN, any combination thereof, or the like. In some embodiments, each of the staircase vias 364 is electrically connected to a corresponding one of the conductive segments 358 (see FIG. 18).

Figure 20:
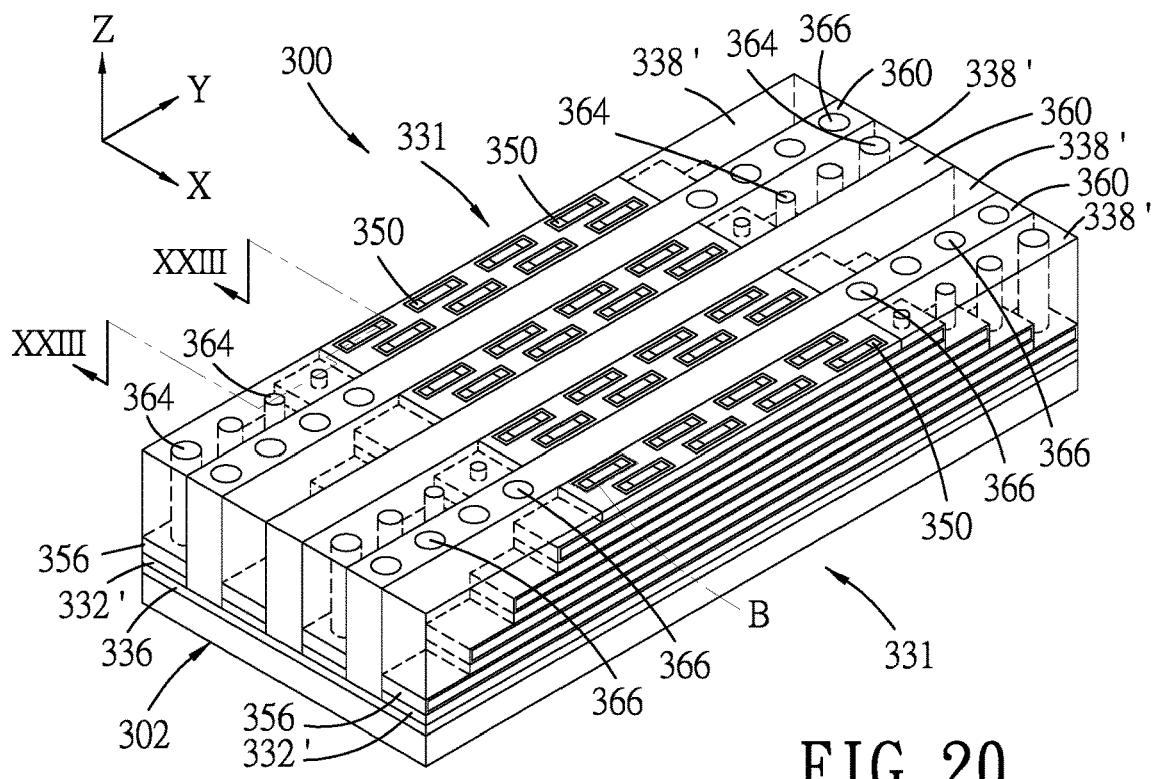

Referring to FIG. 1B, in a step 232 of the method 200, a plurality of conductive vias are formed. Referring to FIGS. 2 and 20, in some embodiments, each of the conductive vias 366 is formed to penetrate a corresponding one of the isolation features 360, the bottom etch stop layer 336 and at least one of the first to fourth ILD layers 312, 314, 316, 318 to be electrically connected to a corresponding one of the conductive features 326, thereby obtaining the memory device 300. In some embodiments, each of the conductive vias 366 may include a suitable conductive material, such as Al, Cu, W, Ti, Co, Ni, Ru, TiN, TaN, TaAlN, any combination thereof, or the like, and may be formed by PVD, CVD, ALD, plating, other suitable techniques, or any combination thereof.

Figure 21:
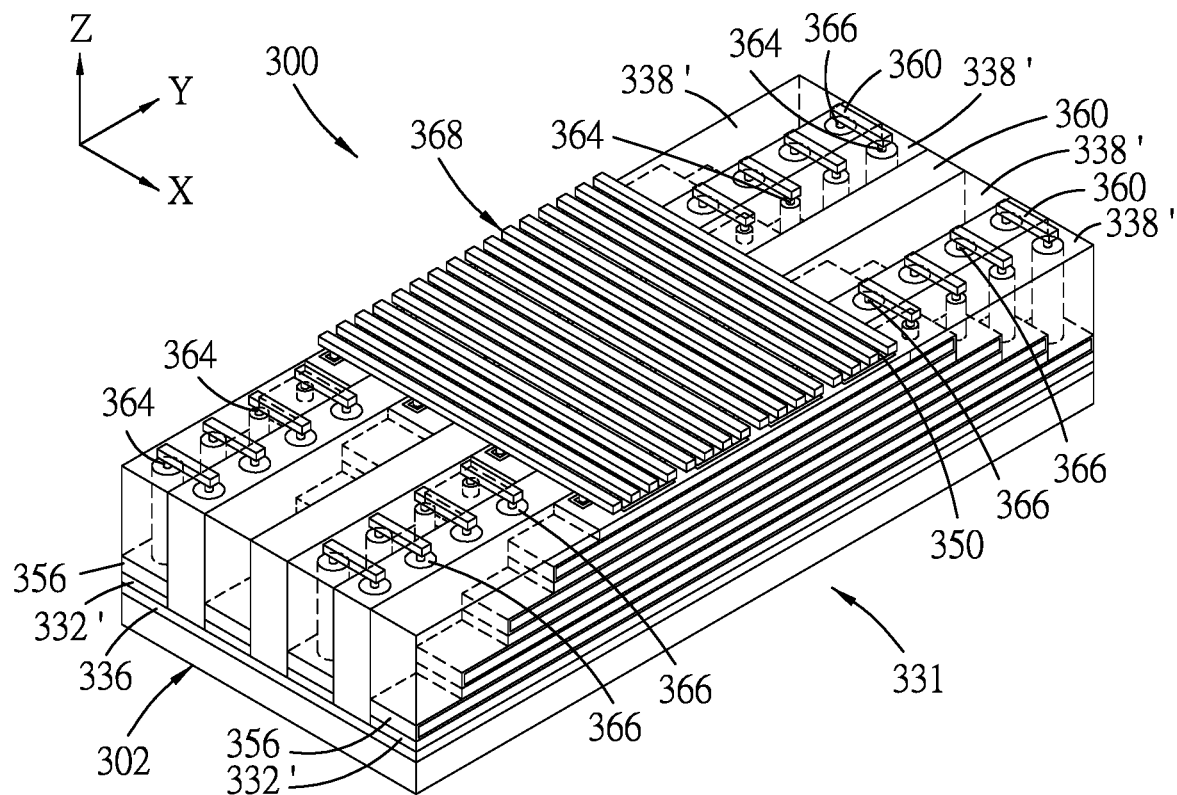
FIG. 21 illustrates that an interconnect structure is formed over a semiconductor memory device in accordance with some embodiments.

Referring to FIGS. 20 and 21, in some embodiments, an interconnect structure 368 may be formed over the memory device 300, so that each of the staircase vias 364 is electrically connected to a corresponding one of the conductive vias 366 and the conductive segments 358 serve as word lines of memory units, and each of the conductive lines 350 is electrically connected to the interconnect structure 368 and serves as a source line or a bit line of THE memory unit.

Figure 22:
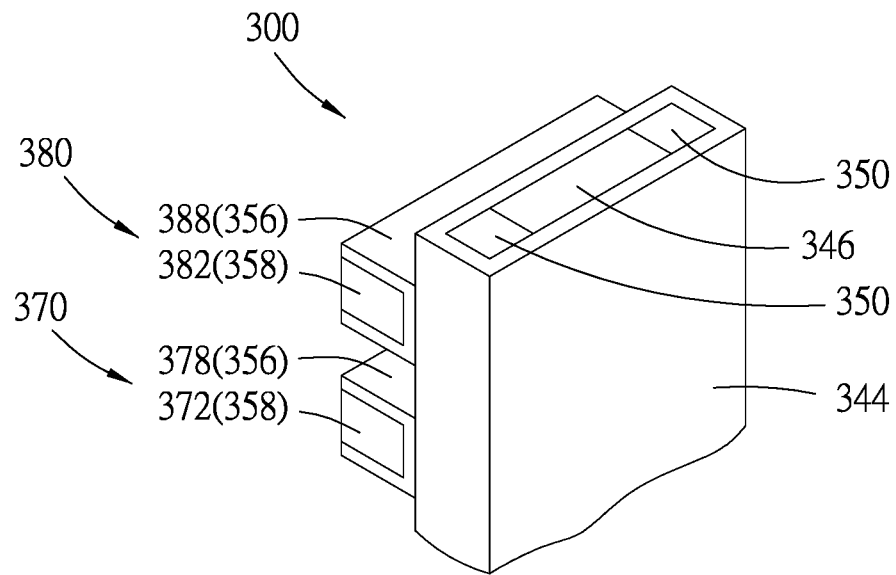
FIG. 22 is a partly perspective view of a semiconductor memory device in accordance with some embodiments.
Figure 23:
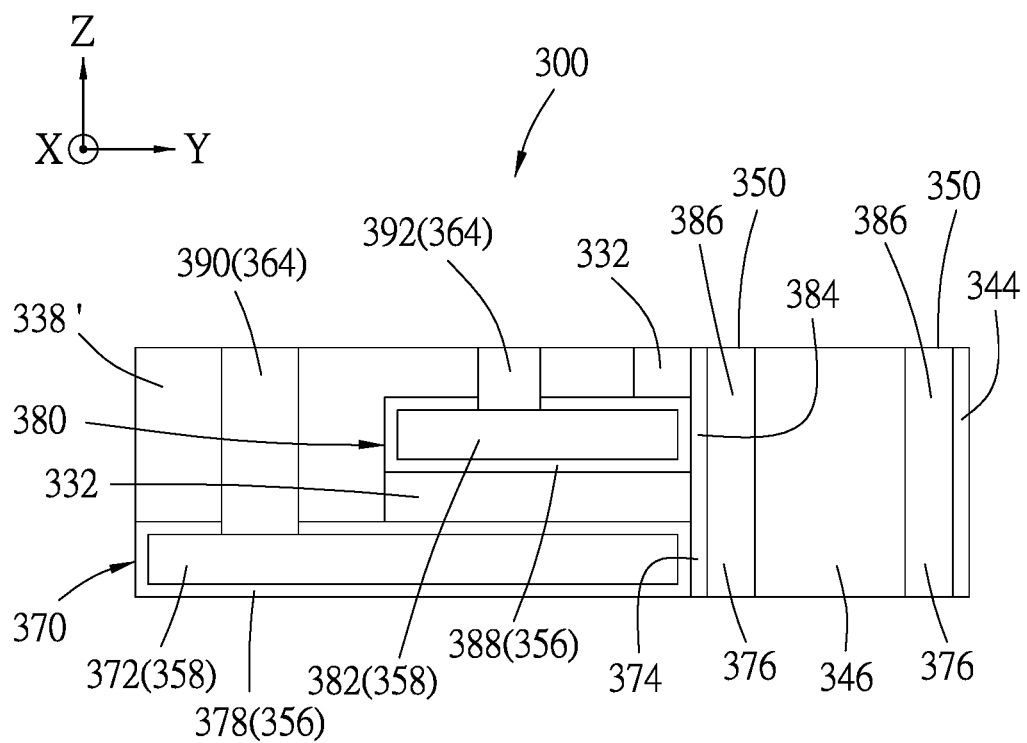
FIG. 23 is a partly sectional view of a semiconductor memory device in accordance with some embodiments.

Referring to FIGS. 20, 22 and 23, where FIG. 22 shows a simplified and partly perspective view of the memory device 300 taken from a dotted block (B) shown in FIG. 20 and only two of the memory segments 356 and two of the conductive segments 358 are shown, and FIG. 23 is a partly sectional view taken from line XXIII-XXIII of FIG. 20. As shown in FIGS. 22 and 23, in some embodiments, the memory device 300 includes a first memory unit 370, a second memory unit 380, a first staircase via 390 (i.e., one of the staircase vias 364 shown in FIG. 23) and a second staircase via 392 (i.e., the other one of the staircase vias 364 shown in FIG. 23). In some embodiments, the first memory unit 370 includes two first source/bit line portions 376 (i.e., portions of the conductive lines 350 shown in FIGS. 22 and 23) that are spaced apart from each other by the isolation segment 346 shown in FIGS. 22 and 23. In some embodiments, the first memory unit 370 further includes a first channel region 374 (which is a part of the channel segment 344 shown in FIG. 23), a first word line 372 (i.e., one of the conductive segments 358 shown in FIG. 23), and a first memory film 378 (i.e., one of the memory segments 356 shown in FIG. 23). In some embodiments, the first word line 372 surrounds the first source/bit line portions 376, and is surrounded by the first memory film 378. In some embodiments, the first channel region 374 is disposed between the first memory film 378 and the first source/bit line portions 376, and is surrounded by the first memory film 378. In some embodiments, the first staircase via 390 penetrates the first memory film 378 and is electrically connected to the first word line 372. In some embodiments, the first word line 372 extends horizontally away from the first source/bit line portions 376, and the first staircase via 390 penetrates a top portion of the first memory film 378. In some embodiments, the second memory unit 380 includes two second source/bit line portions 386 (i.e., portions of the conductive lines 350 shown in FIGS. 22 and 23) that are spaced apart from each other by the isolation segment 346 shown in FIGS. 22 and 23. In some embodiments, the second memory unit 380 further includes a second channel region 384 (which is a part of the channel segment 344 shown in FIG. 23), a second word line 382 (i.e., the other one of the conductive segments 358 shown in FIG. 23), and a second memory film 388 (i.e., the other one of the memory segments 356 shown in FIG. 23). In some embodiments, the second word line 382 surrounds the second source/bit line portions 386, and is surrounded by the second memory film 388. In some embodiments, the second channel region 384 is disposed between the second memory film 388 and the second source/bit line portions 386, and is surrounded by the second memory film 388. In some embodiments, the second staircase via 392 penetrates the second memory film 388 and is electrically connected to the second word line 382. In some embodiments, the second word line 382 extends horizontally away from the second source/bit line portions 386, and the second staircase via 392 penetrates a top portion of the second memory film 388. In some embodiments, each of the first and second memory films 378, 388 (i.e., each of the memory segments 356) may have a thickness ranging from about 1 nm to about 50 nm, from about 1 nm to about 5 nm, from about 5 nm to about 8 nm, from about 8 nm to about 10 nm, from about 10 nm to about 12 nm, from about 12 nm to about 15 nm, from about 15 nm to about 20 nm, from about 20 nm to about 25 nm, from about 25 nm to about 30 nm, from about 30 nm to about 35 nm, from about 35 nm to about 40 nm, from about 40 nm to about 45 nm, from about 45 nm to about 50 nm, or may be in other suitable ranges. In some embodiments, if the thickness of each of the first and second memory films 378, 388 (i.e., each of the memory segments 356) is too thin, such as smaller than about 1 nm, the first and second memory films 378, 388 or the memory segments 356 may not store information correctly, and may not be able to serve as the etch stop layer when forming the staircase via holes 362 (see FIGS. 17 and 18). In some embodiments, if the thickness of each of the first and second memory films 378, 388 (i.e., each of the memory segments 356) is too large, such as larger than about 50 nm, the turn-on current of the memory units may be lowered.

Figure 26:
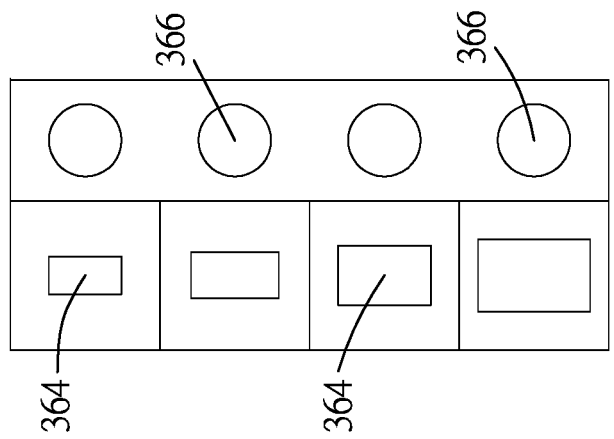
FIGS. 24 to 29 show various shapes of multiple staircase vias of various semiconductor memory devices in accordance with some embodiments.
Figure 25:
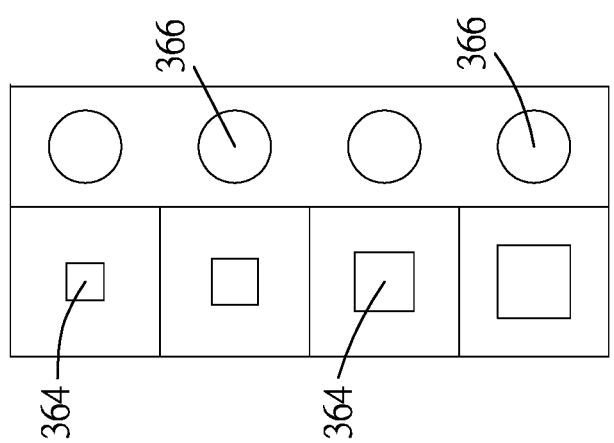
Figure 24:
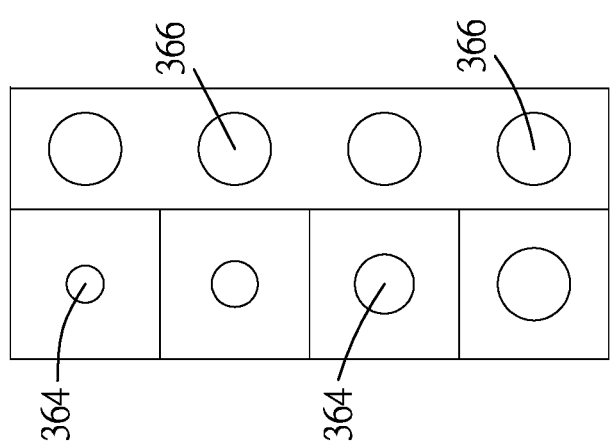
Figure 29:
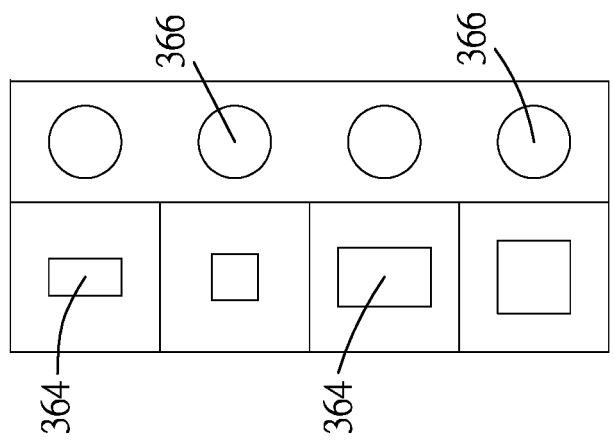
Figure 28:
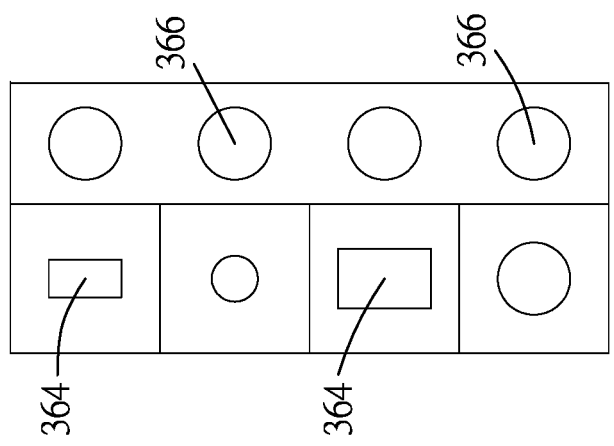
Figure 27:
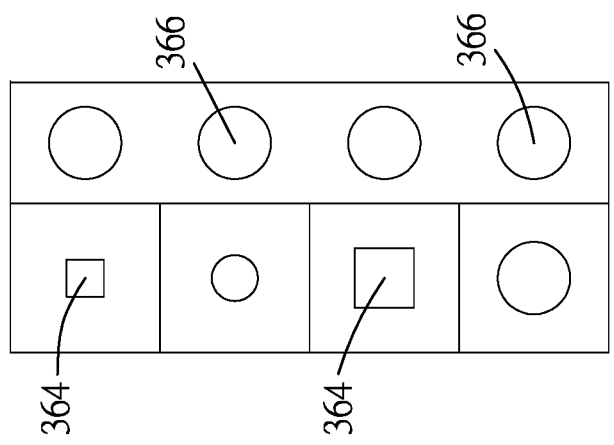

FIGS. 24 to 29 show various embodiments of top views of the staircase vias 364 (i.e., the staircase via holes 362 (see FIGS. 17 and 18)) and the conductive vias 366. As shown in FIG. 24, each of the staircase vias 364 may have a circular top view. As shown in FIG. 25, each of the staircase vias 364 may have a square top view. As shown in FIG. 26, each of the staircase vias 364 may have a rectangular top view. As shown in FIG. 27, the staircase vias 364 may have a mixture of square and circular top views. As shown in FIG. 28, the staircase vias 364 may have a mixture of rectangular and circular top views. As shown in FIG. 29, the staircase vias 364 may have a mixture of rectangular and square top views. The top view of each of the staircase vias 364 is not limited to what are disclosed herein, but can be changed according practical requirements. Although the top view of each of the conductive vias 366 is schematically shown to be circular in FIGS. 24 to 29, it can be changed to square, rectangle, or other suitable shapes according to practical requirements.

The embodiments of the present disclosure have some advantageous features. The staircase via holes 362 with different heights (H1 to H4) are formed utilizing the loading effect principle in a single etching step, where a wider opening is adopted for forming a corresponding staircase via hole 362 with larger height and a smaller opening is adopted for forming a corresponding staircase via hole 362 with smaller height, reducing the possibility of over-etching into the conductive segments 358. For example, if the staircase via holes 362 of FIG. 18 are made to have the same width (i.e., the same size of opening), the rates of etching the inter-metal dielectric segment 338' of FIG. 18 for forming the staircase via holes 362 would be substantially the same. Therefore, when the staircase via hole 362 to the right reaches the topmost conductive segment 358 while other staircase via holes 362 are still being etched, the topmost conductive segment 358 may have been over-etched by the time the other staircase via holes 362 etchings reach their corresponding conductive segments 358. In addition, as shown in FIG. 18, with the memory segments 356 respectively surrounding the conductive segments 358, the memory segments 356 serve as etch stop layers for the formation of the staircase via holes 362. Over-etching of the conductive segments 358 may be prevented with the application of the loading effect principle, the memory segments 356 serving as etch stop layers, or a combination of both.

In accordance with some embodiments of the present disclosure, a semiconductor memory device includes a first memory unit, a second memory unit, a first staircase via and a second staircase via. The first memory unit includes two first source/bit line portions that are separated from each other, a first word line that surrounds the first source/bit line portions, a first memory film that surrounds the first word line, and a first channel region that is disposed between the first memory film and the first source/bit line portions. The second memory unit is disposed over the first memory unit, and includes two second source/bit line portions that are separated from each other, a second word line that surrounds the second source/bit line portions, a second memory film that surrounds the second word line, and a second channel region that is disposed between the second memory film and the second source/bit line portions. The first staircase via penetrates the first memory film and is electrically connected to the first word line. The second staircase via penetrates the second memory film and is electrically connected to the second word line.

In accordance with some embodiments of the present disclosure, a height of the first staircase via is greater than a height of the second staircase via. A width of the first staircase via is greater than a width of the second staircase via.

In accordance with some embodiments of the present disclosure, each of the first memory film and the second memory film is made of ferroelectric material.

In accordance with some embodiments of the present disclosure, the first memory film surrounds the first channel region and the first source/bit line portions. The second memory film surrounds the second channel region and the second course/bit line portions.

In accordance with some embodiments of the present disclosure, the first word line extends horizontally away from the first source/bit line portions. The first staircase via penetrates a top portion of the first memory film. The second word line extends horizontally away from the second source/bit line portions. The second staircase via penetrates a top portion of the second memory film.

In accordance with some embodiments of the present disclosure, the first word line extends horizontally beyond the second word line. The first word line has a vertical thickness greater than a vertical thickness of the second word line.

In accordance with some embodiments of the present disclosure, each of the first and second staircase vias has a circular, square, or rectangular top shape.

In accordance with some embodiments of the present disclosure, each of the first and second memory films has a thickness ranging from about 1 nm to about 50 nm.

In accordance with some embodiments of the present disclosure, a semiconductor memory device includes a semiconductor structure, a plurality of dielectric segments, a plurality of conductive segments, a plurality of channel segments, a plurality of conductive lines, a plurality of memory segments, and a plurality of staircase vias. The dielectric segments and the conductive segments are alternatingly stacked over the semiconductor structure. The channel segments extend through the dielectric segments and the conductive segments. Each of the channel segments surrounds corresponding two of the conductive lines. Each of the memory segments surrounds the channel segments and surrounds a respective one of the conductive segments. The staircase vias respectively penetrate the memory segments and are respectively and electrically connected to the conductive segments.

In accordance with some embodiments of the present disclosure, widths of the staircase vias increase away from the channel segments and the conductive lines.

In accordance with some embodiments of the present disclosure, lengths of the conductive segments increase toward the semiconductor structure. Heights of the staircase vias increase away from the channel segments and the conductive lines.

In accordance with some embodiments of the present disclosure, thicknesses of the conductive segments increase toward the semiconductor structure.

In accordance with some embodiments of the present disclosure, each of the memory segments is made of a ferroelectric material.

In accordance with some embodiments of the present disclosure, each of the staircase vias has a circular, square, or rectangular top shape.

In accordance with some embodiments of the present disclosure, each of the memory segments has a thickness ranging from about 1 nm to about 50 nm.

In accordance with some embodiments of the present disclosure, a method of manufacturing a semiconductor memory device includes: forming an etched stack structure over a semiconductor structure, the etched stack structure including a plurality of first dielectric layers and a plurality of second dielectric layers that are alternatingly stacked over the semiconductor structure and that are divided into a main portion and a staircase portion; covering the staircase portion with an inter-metal dielectric layer; forming a plurality of trenches in the main portion; forming a plurality of channel segments respectively in the trenches and a plurality of isolation segments respectively in the trenches and respectively surrounded by the channel segments; forming a plurality of conductive lines, each of the isolation segments being penetrated by corresponding two of the conductive lines; forming a plurality of slits that penetrate the etched stack structure to form the etched stack structure into a plurality of stack segments each including a main part and two staircase parts; removing the second dielectric layers to form a plurality of spaces; forming a plurality of memory segments respectively in the spaces and surrounding the channel segments; forming a plurality of conductive segments respectively in the spaces, so that each of the conductive segments is surrounded by a respective one of the memory segments; filling the slits with a plurality of isolation features; forming a plurality of staircase via holes in the inter-metal dielectric layer to respectively penetrate the memory segments, widths of the staircase via holes increasing away from the main part; and forming a plurality of conductive vias respectively in the staircase via holes.

In accordance with some embodiments of the present disclosure, one of the second dielectric layers closer to the semiconductor structure has a thickness greater than a thickness of one of the second dielectric layers away from the semiconductor structure, so that one of the conductive segments closer to the semiconductor structure has a thickness greater than a thickness of one of the conductive segments away from the semiconductor structure.

In accordance with some embodiments of the present disclosure, the memory segments are formed to include a ferroelectric material, so that the memory segments serve as etch stop layer when forming the staircase via holes.

In accordance with some embodiments of the present disclosure, in the step of forming the staircase via holes, each of the staircase via holes is formed to have a circular, square, or rectangular top shape.

In accordance with some embodiments of the present disclosure, in the step of forming the memory segments, each of the memory segments is formed to have a thickness ranging from about 1 nm to about 50 nm.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory device comprising:
    a first memory unit including
        two first source/bit line portions that extend in a first direction and that are separated from each other in a second direction perpendicular to the first direction,
        a first word line that extends in the second direction and that surrounds the two first source/bit line portions,
        a first memory film that surrounds the first word line, and
        a first channel region that is disposed between the two first memory film and the first source/bit line portions;
    a second memory unit disposed over the first memory unit in the first direction, and including
        two second source/bit line portions that extend in the first direction and that are separated from each other in the second direction,
        a second word line that extends in the second direction and that surrounds the two second source/bit line portions,
        a second memory film that surrounds the second word line, and
        a second channel region that is disposed between the second memory film and the two second source/bit line portions;
    a first staircase via that penetrates the first memory film and that is electrically connected to the first word line; and
    a second staircase via that penetrates the second memory film and that is electrically connected to the second word line.

2. The semiconductor memory device as claimed in claim 1, wherein a height of the first staircase via is greater than a height of the second staircase via, and a width of the first staircase via is greater than a width of the second staircase via.

3. The semiconductor memory device as claimed in claim 1, wherein:
    the first memory film surrounds the first channel region and the two first source/bit line portions; and
    the second memory film surrounds the second channel region and the two second source/bit line portions.

4. The semiconductor memory device as claimed in claim 1, wherein:
    the first word line extends in the second direction away from the two first source/bit line portions, and the first staircase via penetrates a top portion of the first memory film; and
    the second word line extends in the second direction away from the two second source/bit line portions, and the second staircase via penetrates a top portion of the second memory film.

5. The semiconductor memory device as claimed in claim 1, wherein:
    the first word line extends in the second direction beyond the second word line; and
    the first word line has a vertical thickness greater than a vertical thickness of the second word line.

6. The semiconductor memory device as claimed in claim 1, wherein each of the first and second memory films has a thickness ranging from about 1 nm to about 50 nm.

7. The semiconductor memory device as claimed in claim 1, wherein the first staircase via and the second staircase via extend in the first direction.

8. The semiconductor memory device as claimed in claim 1, wherein the first channel region is in contact with the two first source/bit line portions.

9. A semiconductor memory device comprising:
    a semiconductor structure;
    a plurality of dielectric segments and a plurality of conductive segments that are alternatingly stacked over the semiconductor structure in a first direction perpendicular to the semiconductor structure and that extend in a second direction perpendicular to the first direction;
    a plurality of channel segments that extend through the dielectric segments and the conductive segments in the first direction;
    a plurality of conductive lines that extend in the first direction, each of the channel segments surrounding corresponding two of the conductive lines;
    a plurality of memory segments, each of the memory segments surrounding the channel segments, and surrounding a respective one of the conductive segments; and
    a plurality of staircase vias that respectively penetrate the memory segments and that are respectively and electrically connected to the conductive segments.

10. The semiconductor memory device as claimed in claim 9, wherein widths of the staircase vias increase away from the channel segments and the conductive lines.

11. The semiconductor memory device as claimed in claim 10, wherein:
    lengths of the conductive segments increase toward the semiconductor structure; and
    heights of the staircase vias increase away from the channel segments and the conductive lines.

12. The semiconductor memory device as claimed in claim 11, wherein thicknesses of the conductive segments increase toward the semiconductor structure.

13. The semiconductor memory device as claimed in claim 9, wherein each of the memory segments has a thickness ranging from about 1 nm to about 50 nm.

14. The semiconductor memory device as claimed in claim 9, wherein the staircase vias extend in the first direction.

15. The semiconductor memory device as claimed in claim 9, wherein each of the channel segments is in contact with the corresponding two of the conductive lines.

16. A semiconductor memory device comprising:
    a semiconductor structure;
    a plurality of dielectric segments and a plurality of conductive segments that are alternatingly stacked over the semiconductor structure in a first direction perpendicular to the semiconductor structure and that extend in a second direction perpendicular to the first direction;

a plurality of channel segments that extend through the dielectric segments and the conductive segments in the first direction;

a plurality of conductive lines that extend in the first direction, each of the channel segments surrounding corresponding two of the conductive lines;

a plurality of isolation segments that extend in the first direction, each of the isolation segments being disposed between corresponding two of the conductive lines and being surrounded by a corresponding one of the channel segments;

a plurality of memory segments, each of the memory segments surrounding the channel segments, and surrounding a respective one of the conductive segments; and a plurality of staircase vias that respectively penetrate the memory segments and that are respectively and electrically connected to the conductive segments.

17. The semiconductor memory device as claimed in claim 16, wherein a thickness of each of the conductive segments is equal to a thickness of each of the dielectric segments.

18. The semiconductor memory device as claimed in claim 16, wherein a thickness of each of the dielectric segments is equal to a total thickness of two times a thickness of each of the memory segments and a thickness of a corresponding one of the conductive segments that is surrounded by the each of the memory segments.

19. The semiconductor memory device as claimed in claim 16, wherein each of the memory segments extends a distance beyond a corresponding one of the dielectric segments above the each of the memory segments, and a width of each of the staircase vias is smaller than the distance of a corresponding one of the memory segments that the each of the staircase vias extends through.

20. The semiconductor memory device as claimed in claim 16, wherein each of the channel segments is in contact with the corresponding two of the conductive lines and a corresponding one of the isolation segments.

* * * * *